(12) United States Patent
Lin et al.

(10) Patent No.: US 12,191,393 B2
(45) Date of Patent: Jan. 7, 2025

(54) LOW Ge ISOLATED EPITAXIAL LAYER GROWTH OVER NANO-SHEET ARCHITECTURE DESIGN FOR RP REDUCTION

(71) Applicant: Taiwan Semiconductor Manufacturing Co., Ltd., Hsinchu (TW)

(72) Inventors: Yan-Ting Lin, Baoshan Township (TW); Yen-Ru Lee, Hsinchu (TW); Chien-Chang Su, Kaohsiung (TW); Chih-Yun Chin, Taichung (TW); Chien-Wei Lee, Kaohsiung (TW); Pang-Yen Tsai, Jhubei (TW); Chii-Horng Li, Zhubei (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 246 days.

(21) Appl. No.: 17/239,328

(22) Filed: Apr. 23, 2021

(65) Prior Publication Data

US 2022/0344516 A1    Oct. 27, 2022

(51) Int. Cl.
*H01L 29/786* (2006.01)
*H01L 21/02* (2006.01)
(Continued)

(52) U.S. Cl.
CPC .................. *H01L 29/78618* (2013.01); *H01L 21/02532* (2013.01); *H01L 21/0259* (2013.01);
(Continued)

(58) Field of Classification Search
CPC .................. H01L 29/06; H01L 29/786; H01L 29/78618; H01L 29/66553;
(Continued)

(56) References Cited

U.S. PATENT DOCUMENTS

| | | | |
|---|---|---|---|
| 9,093,530 B2 | 7/2015 | Huang et al. |
| 9,171,929 B2 | 10/2015 | Lee et al. |
| 9,209,247 B2 | 12/2015 | Colinge et al. |
| 9,214,555 B2 | 12/2015 | Oxland et al. |
| 9,236,267 B2 | 1/2016 | De et al. |
| 9,412,817 B2 | 8/2016 | Yang et al. |

(Continued)

FOREIGN PATENT DOCUMENTS

TW           202105731 A      2/2021

*Primary Examiner* — Eric K Ashbahian
*Assistant Examiner* — Halee Cramer
(74) *Attorney, Agent, or Firm* — Slater Matsil, LLP

(57) ABSTRACT

A nano-FET and a method of forming is provided. In some embodiments, a nano-FET includes an epitaxial source/drain region contacting ends of a first nanostructure and a second nanostructure. The epitaxial source/drain region may include a first semiconductor material layer of a first semiconductor material, such that the first semiconductor material layer includes a first segment contacting the first nanostructure and a second segment contacting the second nanostructure, wherein the first segment is separated from the second segment. A second semiconductor material layer is formed over the first segment and the second segment. The second semiconductor material layer may include a second semiconductor material having a higher concentration of dopants of a first conductivity type than the first semiconductor material layer. The second semiconductor material layer may have a lower concentration percentage of silicon than the first semiconductor material layer.

20 Claims, 36 Drawing Sheets

(51) Int. Cl.
*H01L 21/8238* (2006.01)
*H01L 27/092* (2006.01)
*H01L 29/06* (2006.01)
*H01L 29/423* (2006.01)
*H01L 29/66* (2006.01)
*H01L 29/78* (2006.01)

(52) U.S. Cl.
CPC ............... *H01L 21/823807* (2013.01); *H01L 21/823814* (2013.01); *H01L 21/823864* (2013.01); *H01L 27/092* (2013.01); *H01L 29/0665* (2013.01); *H01L 29/42392* (2013.01); *H01L 29/66553* (2013.01); *H01L 29/66636* (2013.01); *H01L 29/66742* (2013.01); *H01L 29/7848* (2013.01); *H01L 29/78696* (2013.01)

(58) Field of Classification Search
CPC ........... H01L 29/66636; H01L 29/7848; H01L 29/0673; H01L 29/66787; H01L 29/66795; H01L 21/3065; H01L 21/02; H01L 21/02532; H01L 21/823814
See application file for complete search history.

(56) References Cited

U.S. PATENT DOCUMENTS

| | | | |
|---|---|---|---|
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 11,532,734 B2 | 12/2022 | Bomberger et al. | |
| 2005/0093021 A1* | 5/2005 | Ouyang | H01L 29/1054 257/E21.431 |
| 2017/0250250 A1* | 8/2017 | Bentley | H01L 29/165 |
| 2017/0365604 A1* | 12/2017 | Suh | H01L 21/823878 |
| 2019/0157386 A1* | 5/2019 | Ando | H01L 21/02543 |
| 2019/0165135 A1* | 5/2019 | Cheng | H01L 29/66818 |
| 2020/0043926 A1* | 2/2020 | Ohtou | H01L 29/0649 |
| 2020/0051981 A1* | 2/2020 | Yang | H01L 27/092 |

* cited by examiner

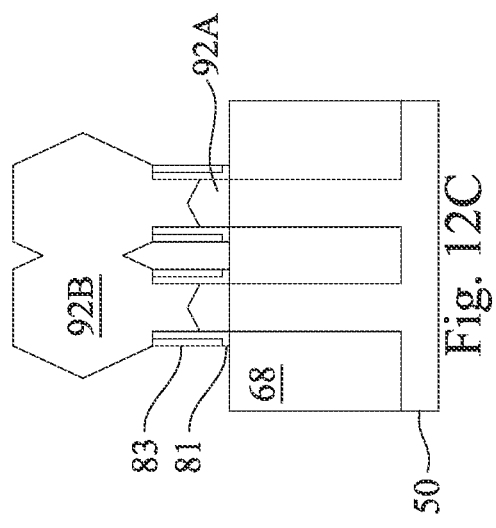
Fig. 12C
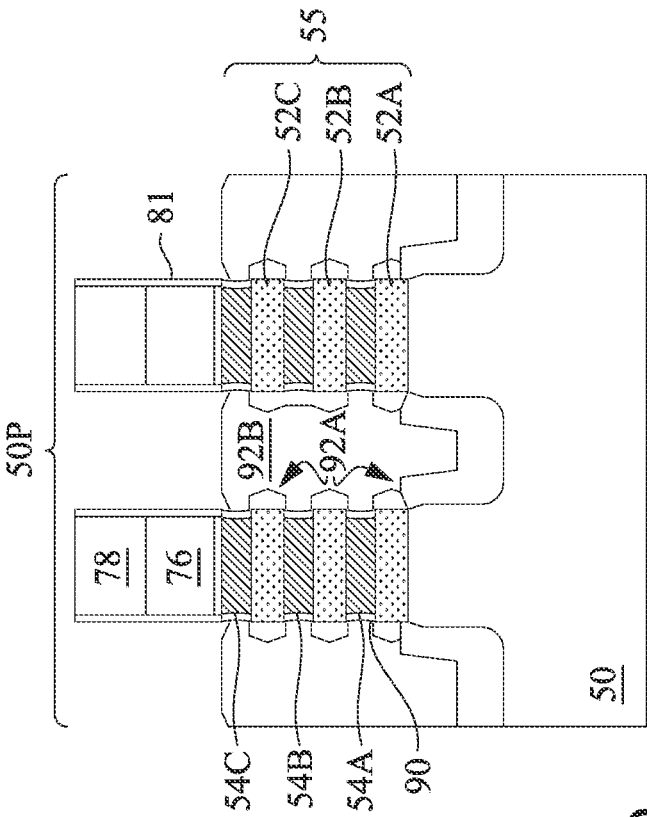
Fig. 12D
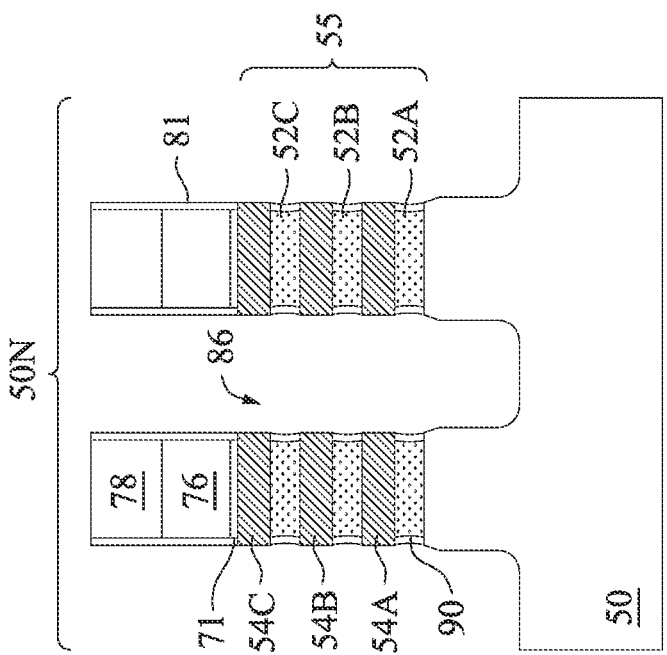

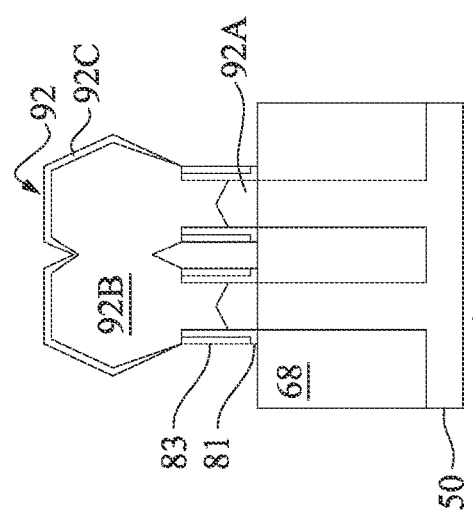
Fig. 12E
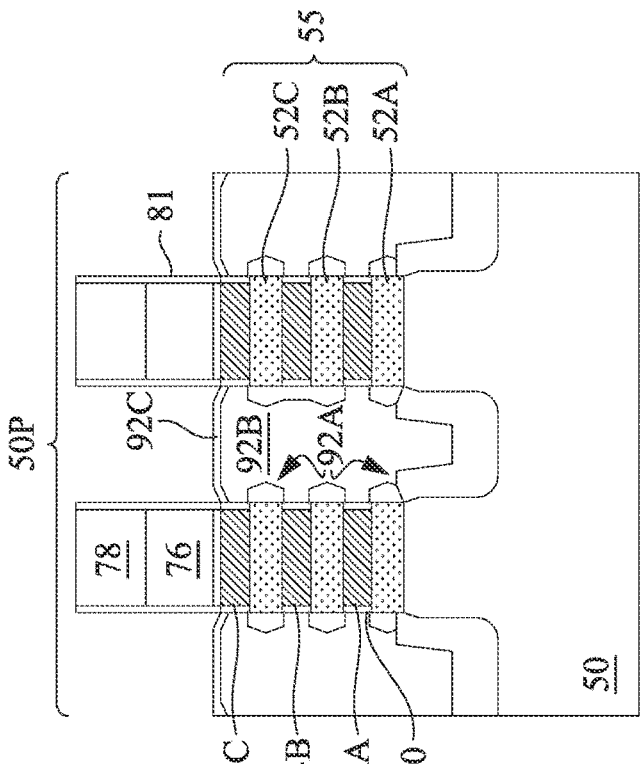
Fig. 12F
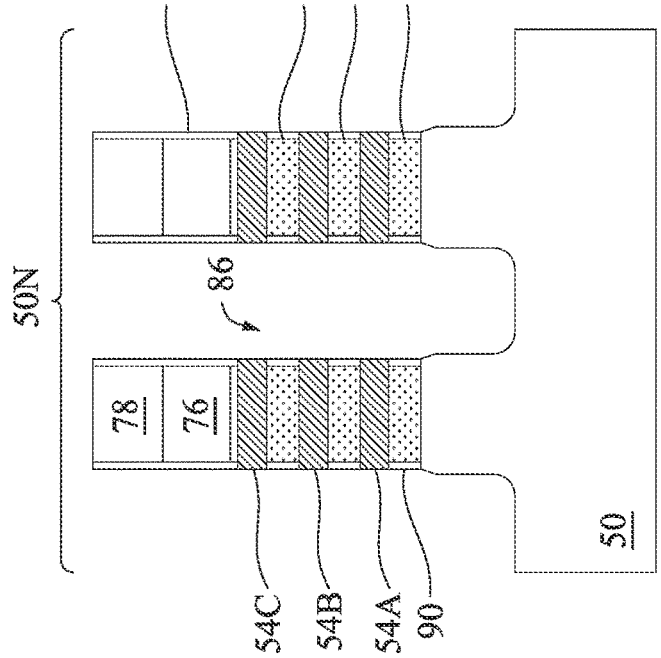

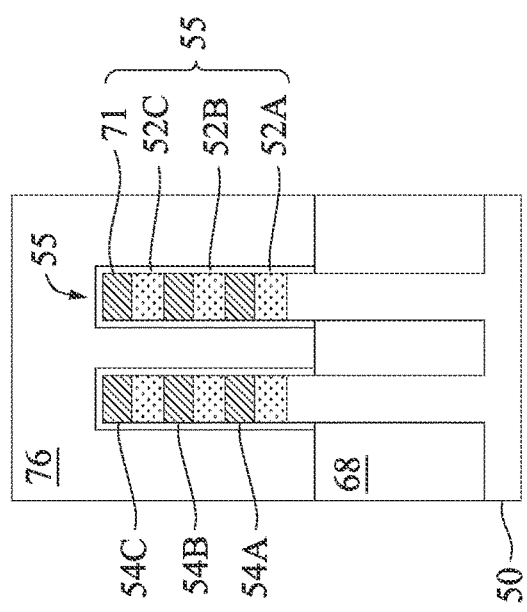
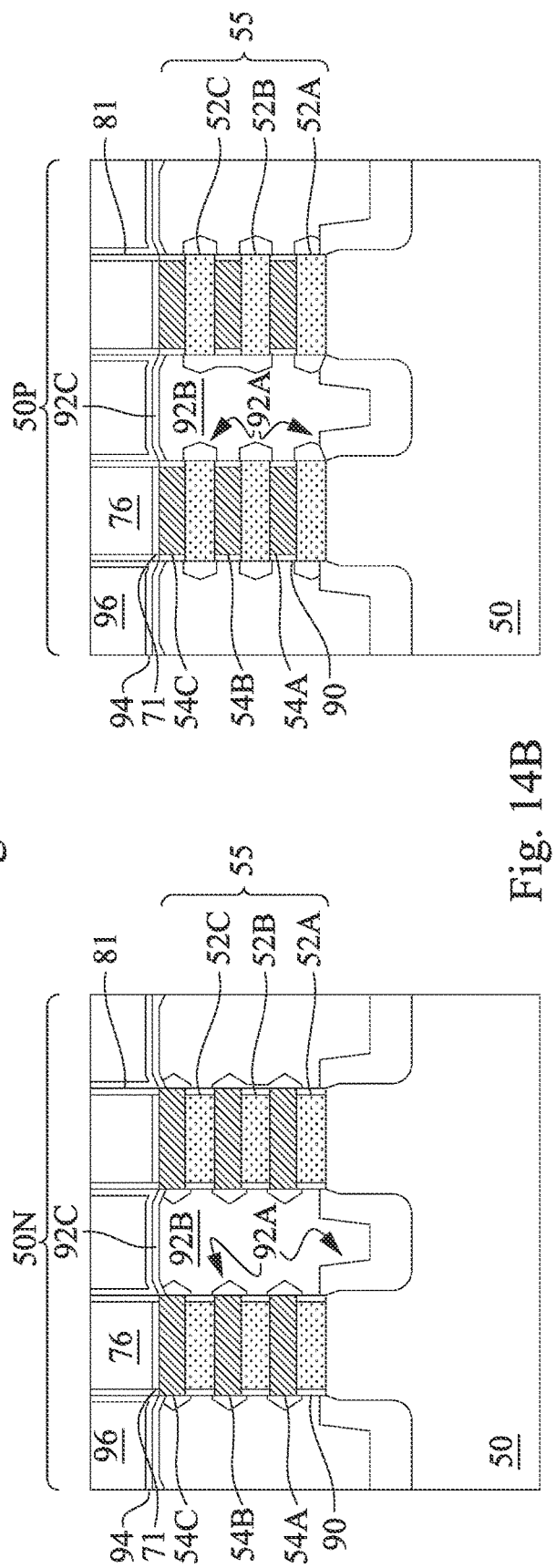
Fig. 14A
Fig. 14B

LOW Ge ISOLATED EPITAXIAL LAYER GROWTH OVER NANO-SHEET ARCHITECTURE DESIGN FOR RP REDUCTION

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B 8A, 8B, 9A, 9B, 10A, 10B, 11A, 11B, 11C, 12A, 12B, 12C, 12D, 12E, 12F, 12G, 12H, 12I, 12J, 13A, 13B, 13C, 14A, 14B, 15A, 15B, 16A, 16B, 17A, 17B, 18A, 18B, 18C, 19A, 19B, 19C, 20A, 20B, and 20C are cross-sectional views of intermediate stages in the manufacturing of nano-FETs, in accordance with some embodiments.

DETAILED DESCRIPTION

Figure 1:
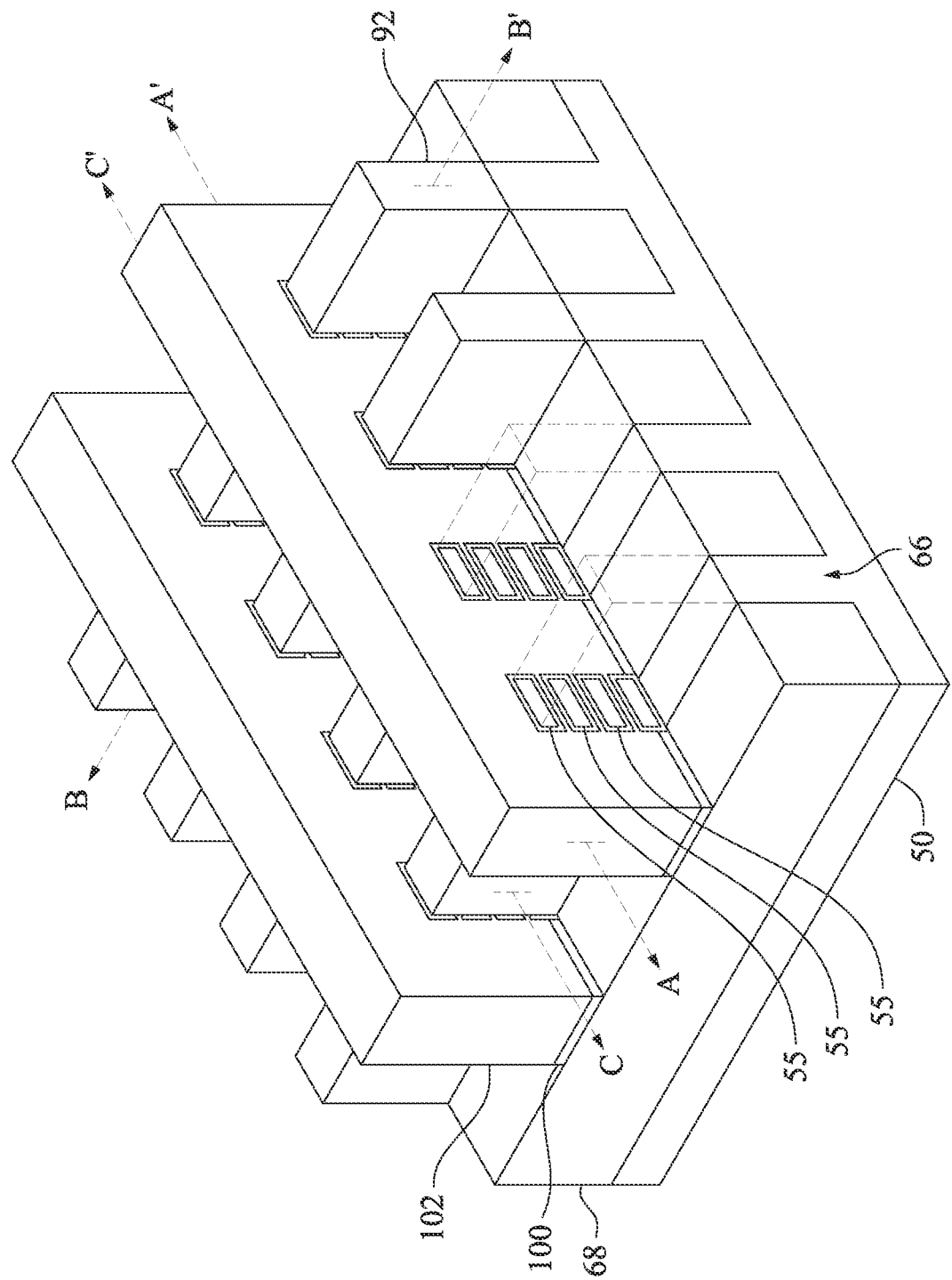
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The method and device described below uses a multi-step process for forming the epitaxial source/drain regions of a nano-FET. Generally, ends of nanostructures acting as channels for the nano-FETs are exposed and a multi-step process is performed to epitaxially grow source/drain regions from the ends of the nanostructures. The multi-step process is performed such that a first epitaxial layer grown on the ends of the nanostructures is less likely to merge between some or all of nanostructures. Subsequently, a second bottom-up growth process is used to form a second semiconductor material layer in the epitaxial source/drain region that reduces the creation of stacking fault defects in the epitaxial source/drain regions. By using the methods described below, a nano-FET can be realized that has higher current carrying capabilities, lower internal resistances, and enhanced electrical performance.

FIG. 1 illustrates an example of nano-FETs (e.g., nanowire FETs, nanosheet FETs, or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is perpendicular to cross-section A-A' and is parallel to a longitudinal axis of a fin 66 of the nano-FET and in a direction of, for example, a current flow between the epitaxial source/drain regions 92 of the nano-FET. Cross-section C-C' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 20C are cross-sectional views of intermediate stages in the manufacturing of nano-FETs, in accordance with some embodiments. FIGS. 2 through 5, 6A, 13A, 14A, 15A, 16A, 17A, 18A, 19A, and 20A illustrate reference cross-section A-A' illustrated in FIG. 1. FIGS. 6B, 7B, 8B, 9B, 10B, 11B, 11C, 12B, 12D, 12F, 12H, 12I, 12J, 13B, 14B, 15B, 16B, 17B, 18B, 19B, and 20B illustrate reference cross-section B-B' illustrated in FIG. 1. FIGS. 7A, 8A, 9A, 10A, 11A, 12A, 12C, 12E, 12G, 13C, 18C, 19C, and 20C illustrate reference cross-section C-C' illustrated in FIG. 1.

Figure 2:
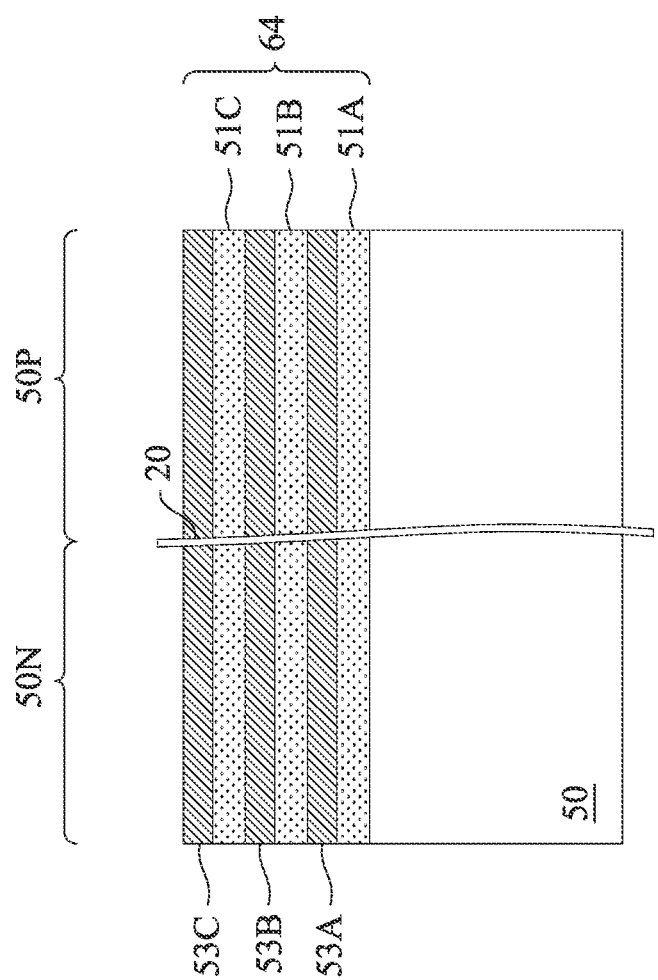

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nano-FETs in the p-type region 50P. Also, the first semiconductor layers 51 will be removed and the second semiconductor layers 53 will be patterned to form channel regions of nano-FETs in the n-type regions 50N. Nevertheless, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type regions 50P.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium, germanium tin, or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material in the n-type region 50N, thereby allowing the second semiconductor layers 53 to be patterned to form channel regions of n-type NSFETS. Similarly, the second semiconductor layers 53 of the second semiconductor material may be removed without significantly removing the first semiconductor layers 51 of the first semiconductor material in the p-type region 50P, thereby allowing the first semiconductor layers 51 to be patterned to form channel regions of p-type NSFETS.

Figure 3:
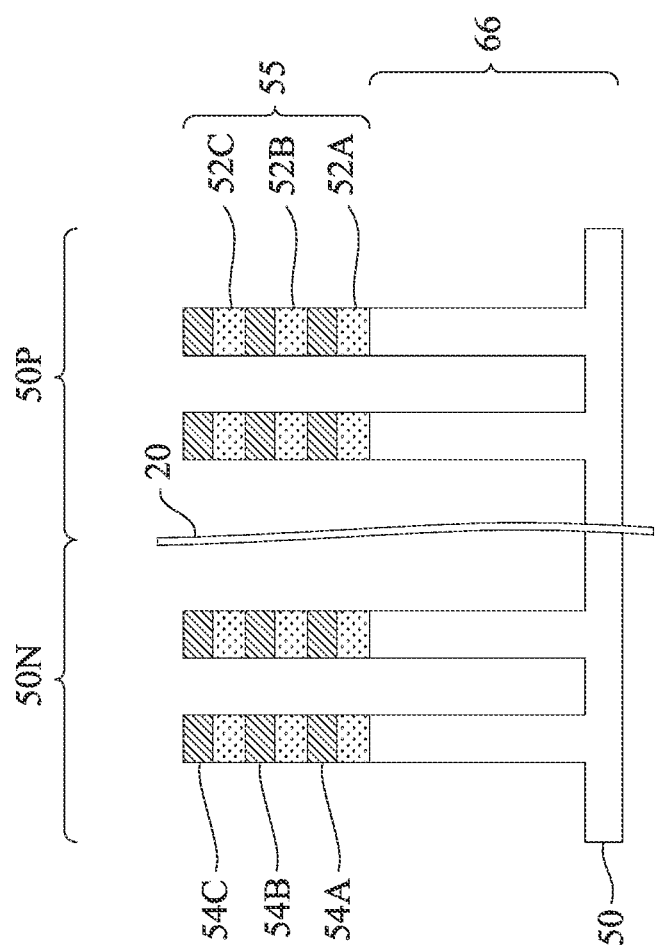

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and define second nanostructures 54A-C (collectively referred to as the second nanostructures 54) from the second semiconductor layers 53. The first nanostructures 52 and the second nanostructures 54 may further be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
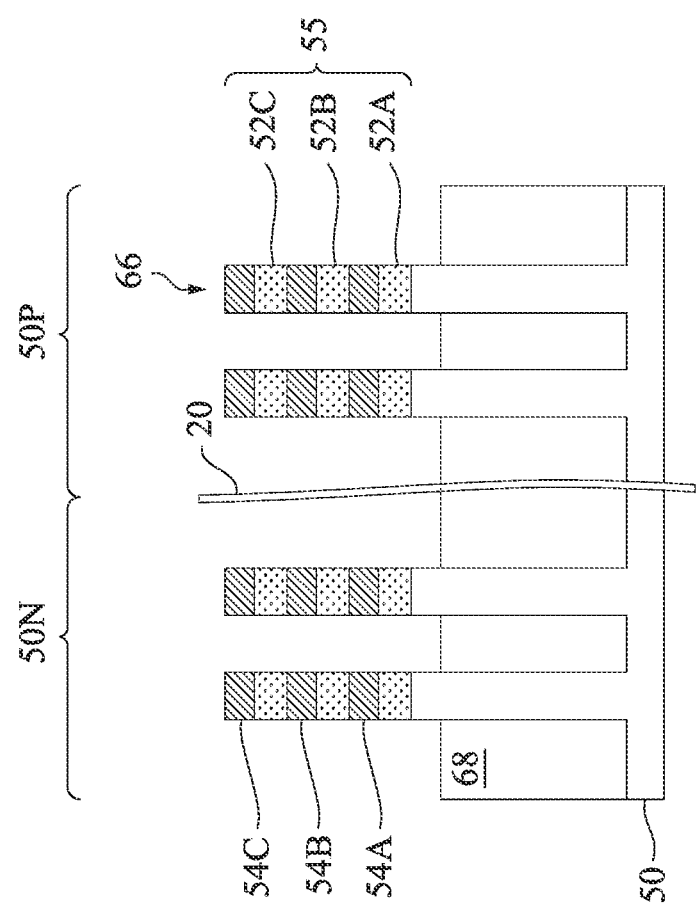

In FIG. 4, isolation regions 68 are formed adjacent the fins 66. The isolation regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the isolation regions 68. The insulation material is recessed such that upper portions of fins 66 in the n-type region 50N and the p-type region 50P protrude from between neighboring isolation regions 68. Further, the top surfaces of the isolation regions 68 may have a flat surface as illustrated, a convex surface, a concave surface (such as dishing), or a combination thereof. The top surfaces of the isolation regions 68 may be formed flat, convex, and/or concave by an appropriate etch. The isolation regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the isolation regions 68. In embodiments with different well types, different implant steps for the n-type region 50N and the p-type region 50P may be achieved using a photoresist or other masks (not separately illustrated). For example, a photoresist may be formed over the fins 66 and the isolation regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{16}$ atoms/cm$^3$ to about $10^{18}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the isolation regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{16}$ atoms/cm$^3$ to about $10^{18}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
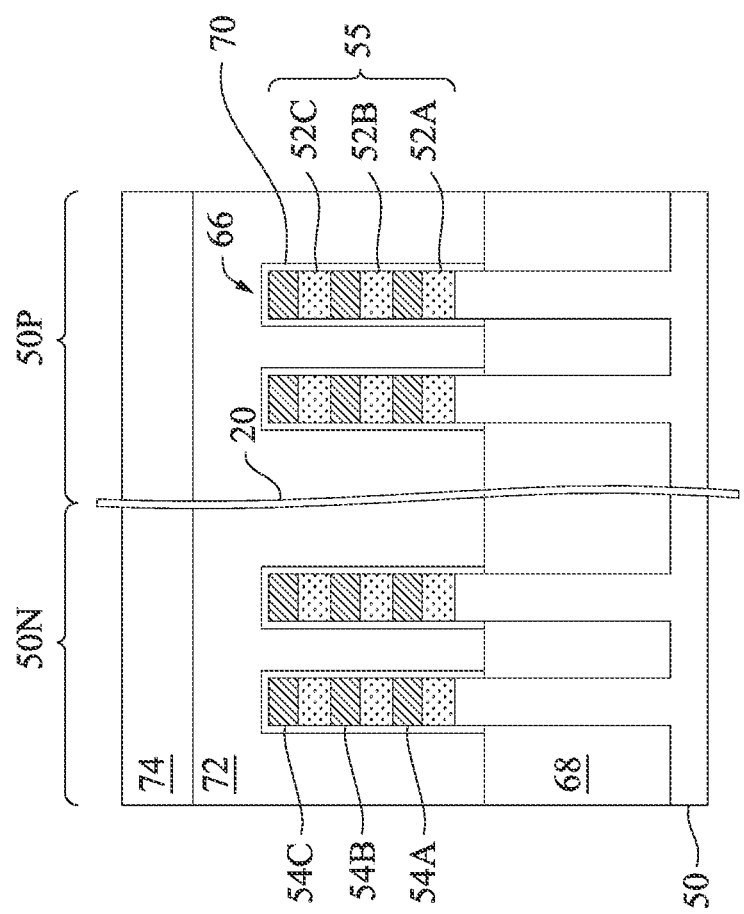

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the isolation regions 68, such that the dummy dielectric layer 70 extends between the dummy gate layer 72 and the isolation regions 68.

Figure 6A:
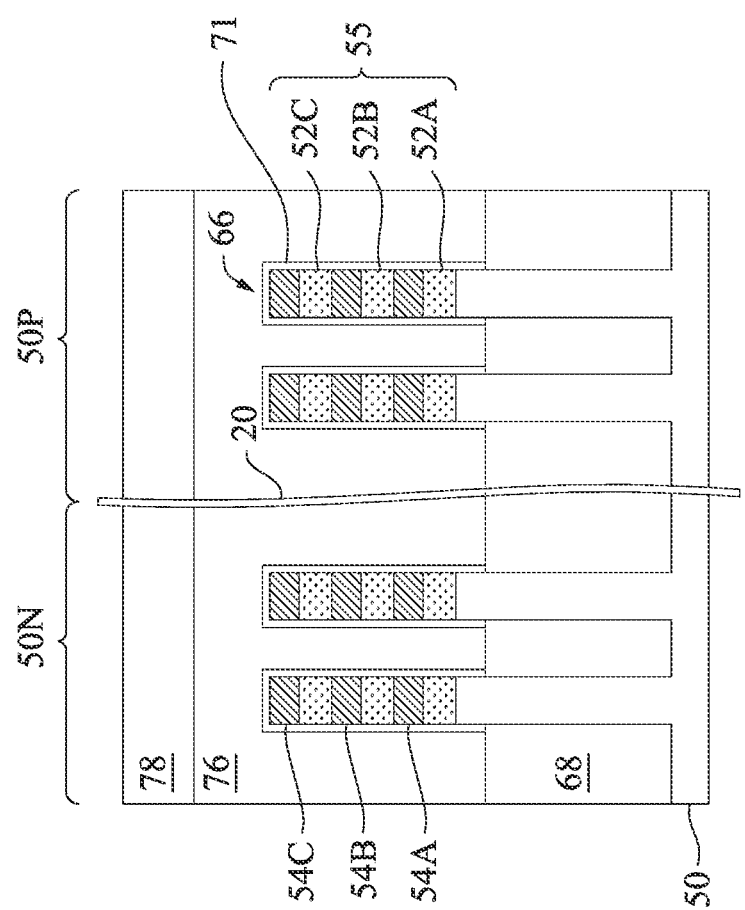
Figure 6B:
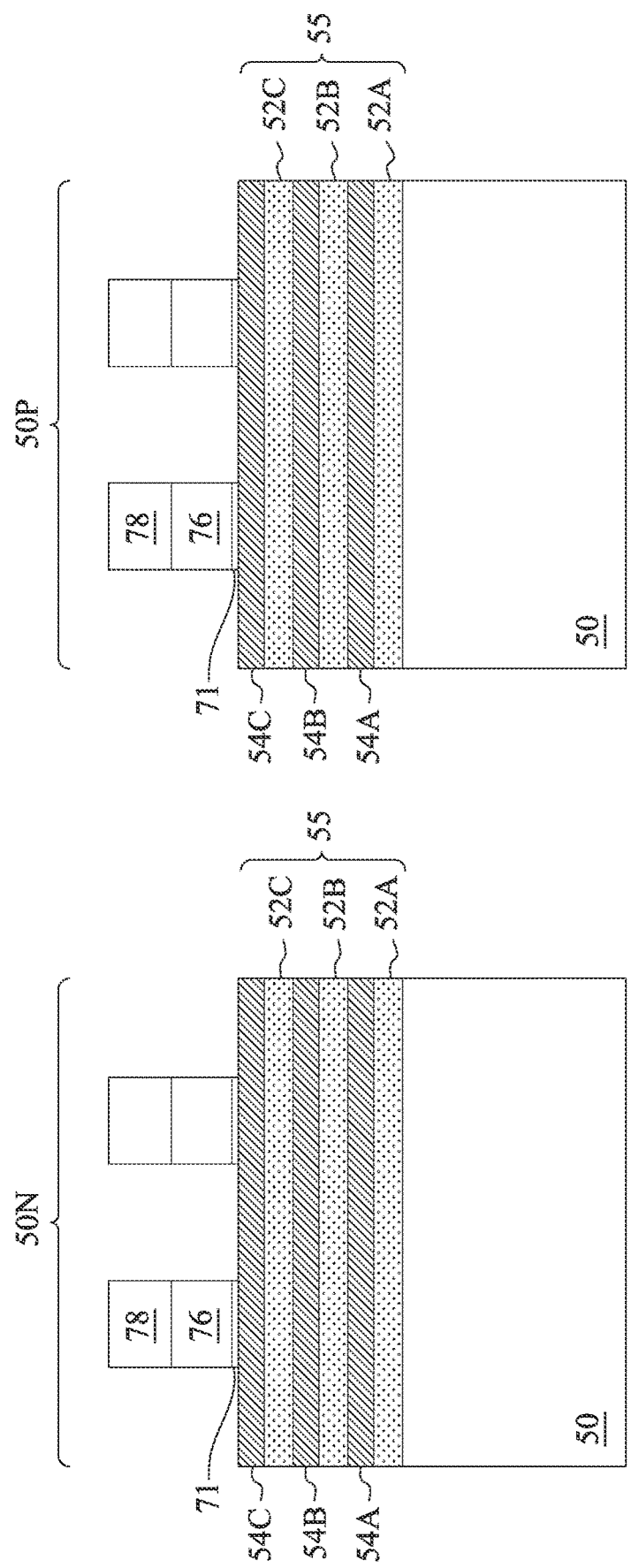

FIGS. 6A through 18C illustrate various additional steps in the manufacturing of embodiment devices. FIGS. 7A, 8A, 9A, 10A, 11A, 12A, 12C, 12E, 12G, 13A, 13C, 14A, 15A, 18C, 19C, and 20C illustrate features in either the n-type region 50N or the p-type region 50P. In FIGS. 6A and 6B, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7A:
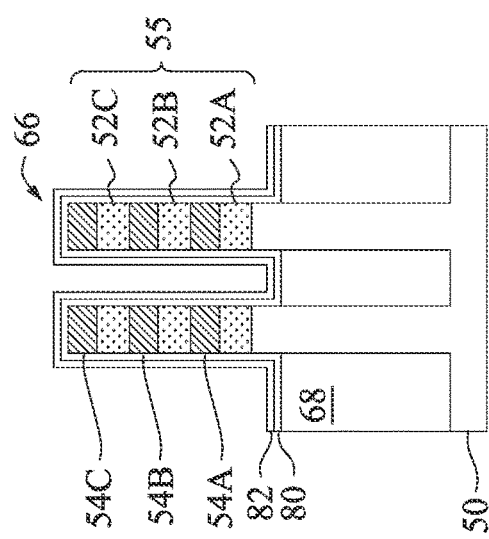
Figure 7B:
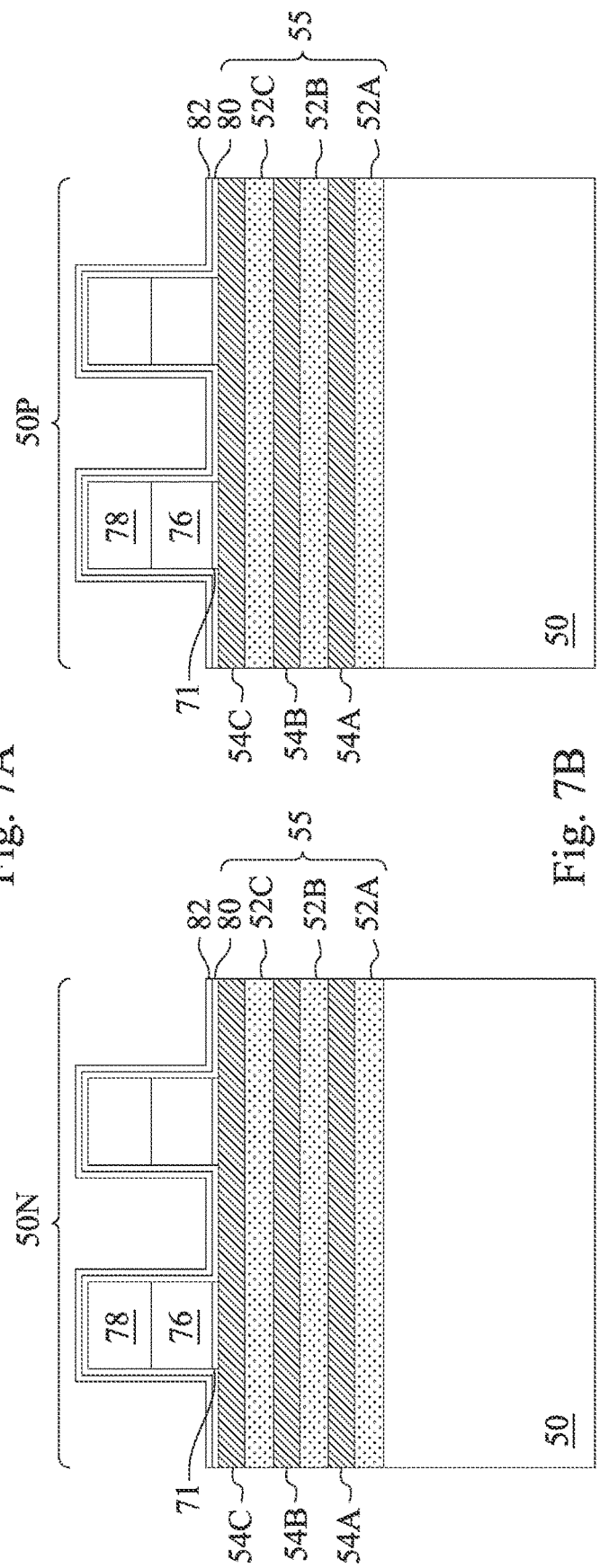

In FIGS. 7A and 7B, a first spacer layer 80 and a second spacer layer 82 are formed over the structures illustrated in FIGS. 6A and 6B, respectively. The first spacer layer 80 and the second spacer layer 82 will be subsequently patterned to act as spacers for forming self-aligned source/drain regions. In FIGS. 7A and 7B, the first spacer layer 80 is formed on top surfaces of the isolation regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figure 8A:
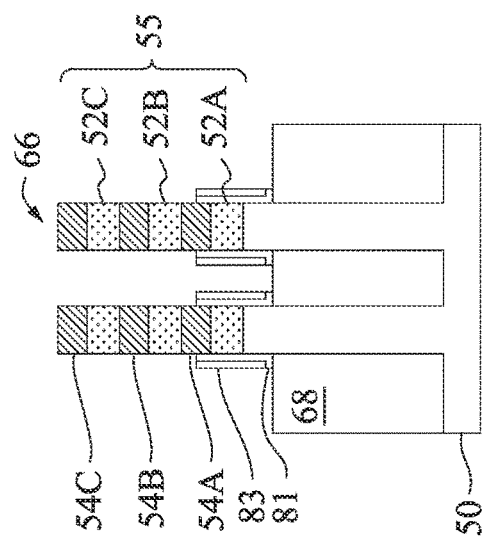
Figure 8B:
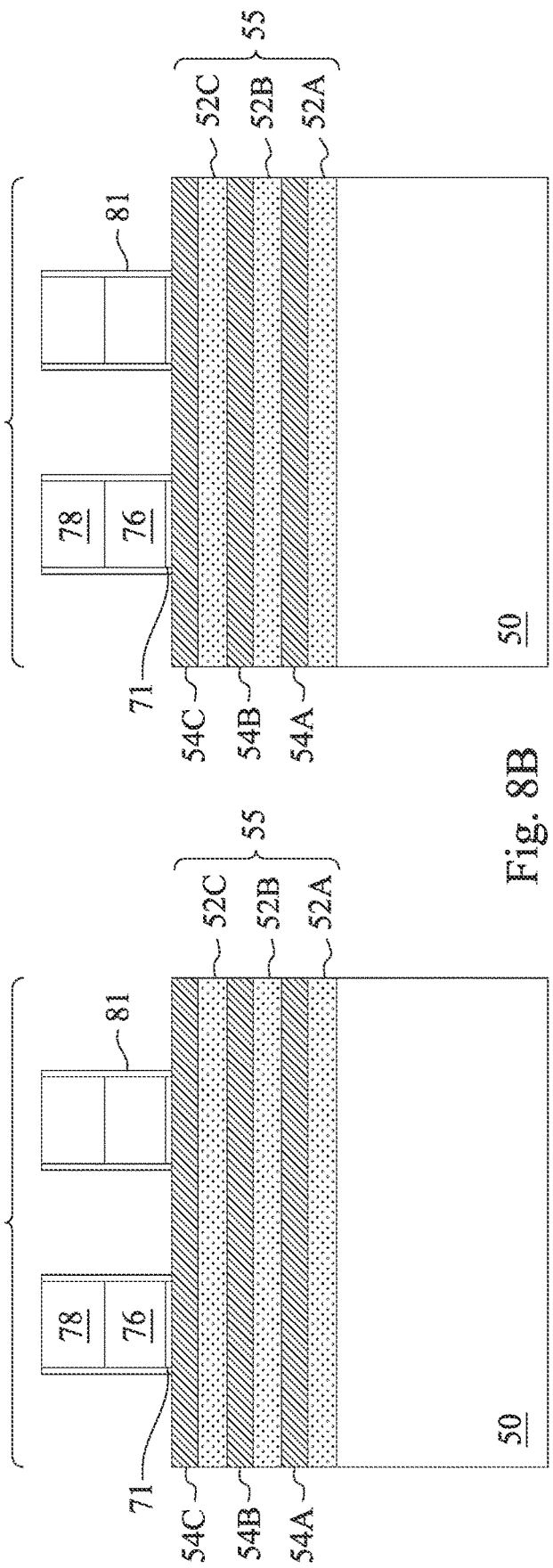

In FIGS. 8A and 8B, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 acts as a mask while etching exposed portions of the first spacer layer 80, thereby forming first spacers 81 as illustrated in FIG. 8A.

As illustrated in FIG. 8A, the first spacers 81 and the second spacers 83 are disposed on sidewalls of the fins 66 and/or nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy dielectric layers 60. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9A:
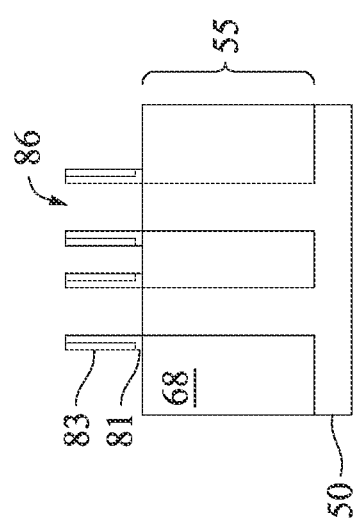
Figure 9B:
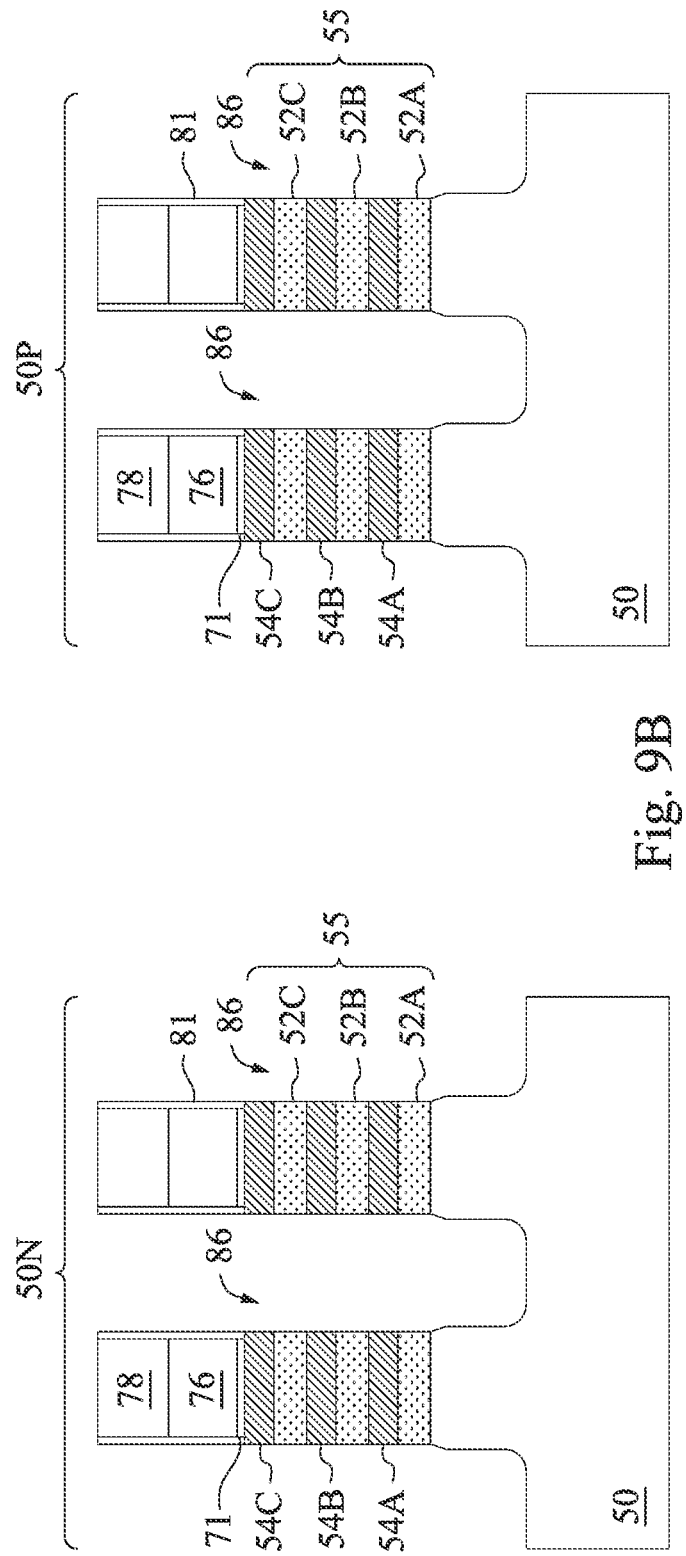

In FIGS. 9A and 9B, first recesses 86 are formed in the fins 66, the nanostructures 55, and the substrate 50, in accordance with some embodiments. Epitaxial source/drain regions will be subsequently formed in the first recesses 86. The first recesses 86 may extend through the first nanostructures 52 and the second nanostructures 54, and into the substrate 50. As illustrated in FIG. 9A, top surfaces of the isolation regions 68 may be level with bottom surfaces of the first recesses 86. In various embodiments, the fins 66 may be etched such that bottom surfaces of the first recesses 86 are disposed below the top surfaces of the isolation regions 68; or the like. The first recesses 86 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

Figure 10A:
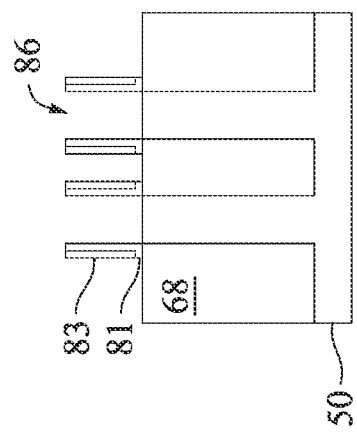
Figure 10B:
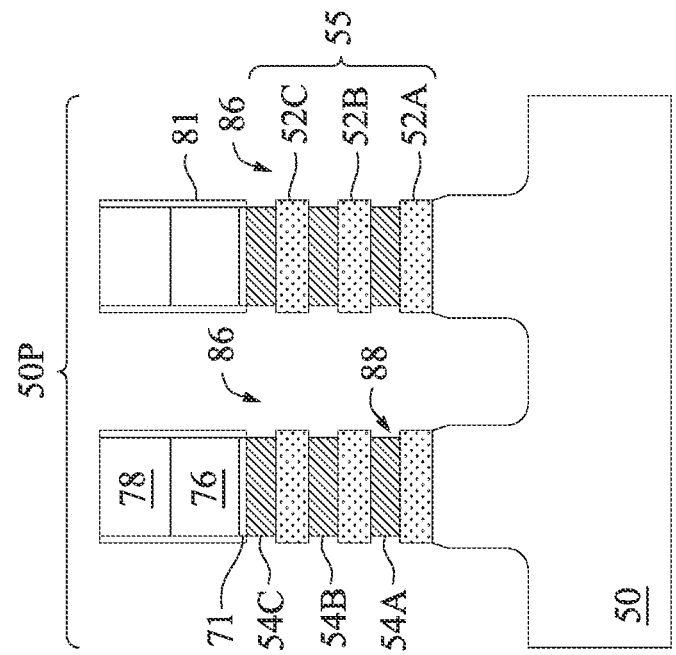
Figure 10B:
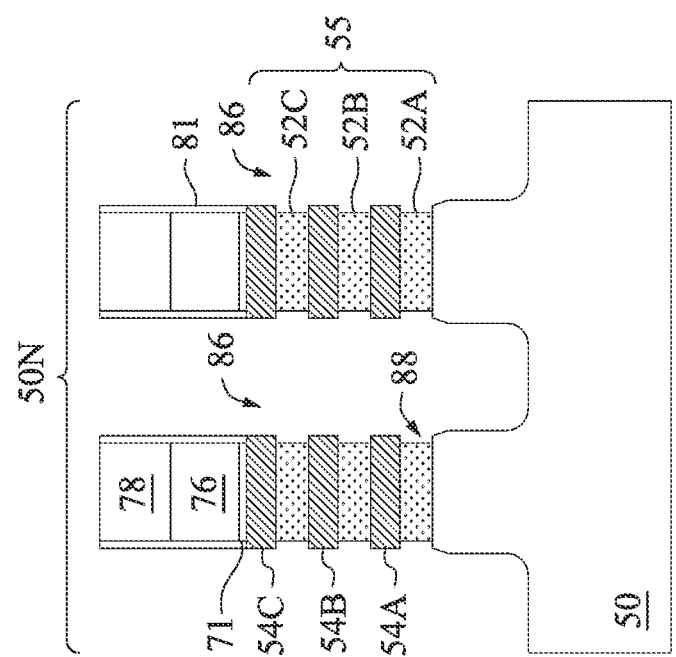

In FIGS. 10A and 10B, portions of sidewalls of the layers of nanostructures 55 formed of the first semiconductor materials (e.g., the first nanostructures 52) exposed by the first recesses 86 are etched to form sidewall recesses 88 in the n-type region 50N, and portions of sidewalls of the layers of the nano structures 55 formed of the second semiconductor materials (e.g., the second nanostructures 54) exposed by the first recesses 86 are etched to form sidewall recesses 88 in the p-type region 50P. Although sidewalls of the first nanostructures 52 and the second nanostructures 54 in sidewall recesses 88 are illustrated as being straight in FIG. 10B, the sidewalls may be concave or convex. The sidewalls may be etched using isotropic etching processes, such as wet etching or the like. The p-type region 50P may be protected using a mask (not shown) while etchants selective to the first semiconductor materials are used to etch the first nanostructures 52 such that the second nanostructures 54 and the substrate 50 remain relatively unetched as compared to the first nanostructures 52 in the n-type region 50N. Similarly, the n-type region 50N may be protected using a mask (not shown) while etchants selective to the second semiconductor materials are used to etch the second nanostructures 54 such that the first nanostructures 52 and the substrate 50 remain relatively unetched as compared to the second nanostructures 54 in the p-type region 50P. In embodiments in which the first nanostructures 52 include, e.g., SiGe, and the second nanostructures 54 include, e.g., Si or SiC, a dry etch process with tetramethylammonium hydroxide (TMAH), ammonium hydroxide (NH$_4$OH), or the like may be used to etch sidewalls of the first nanostructures 52 in the n-type region 50N, and a dry etch process with hydrogen fluoride, another fluorine-based gas, or the like may be used to etch sidewalls of the second nanostructures 54 in the p-type region 50P.

Figure 11A:
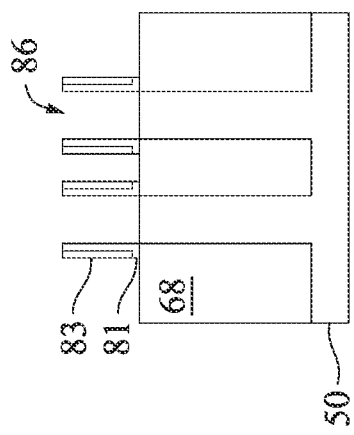
Figure 11B:
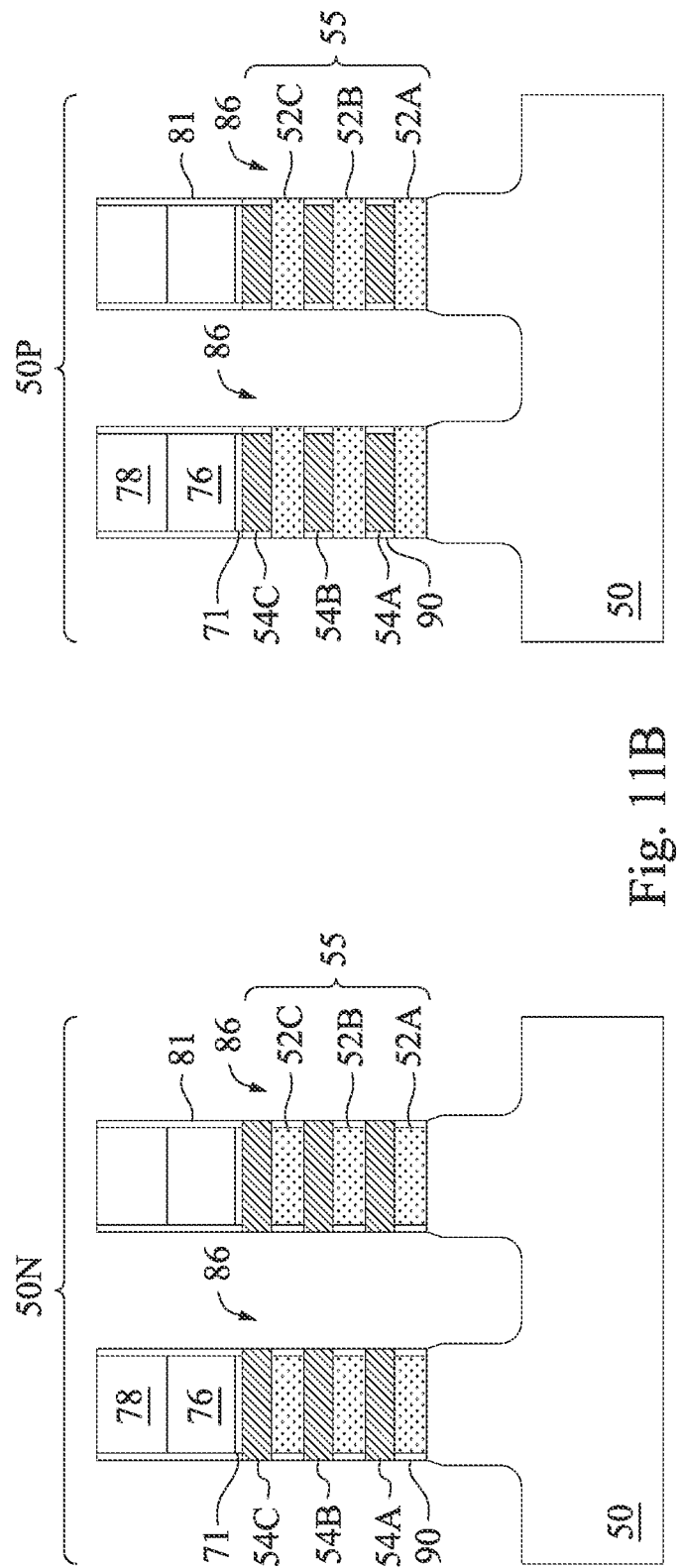
Figure 11C:
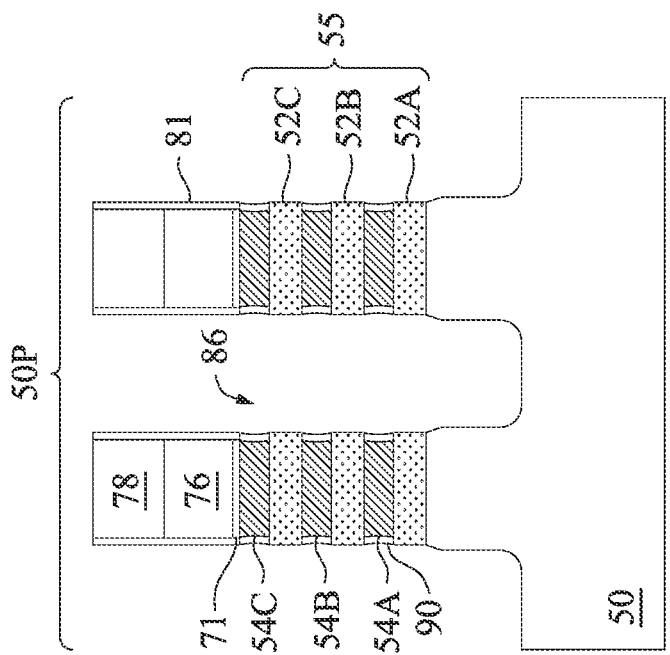
Figure 11C:
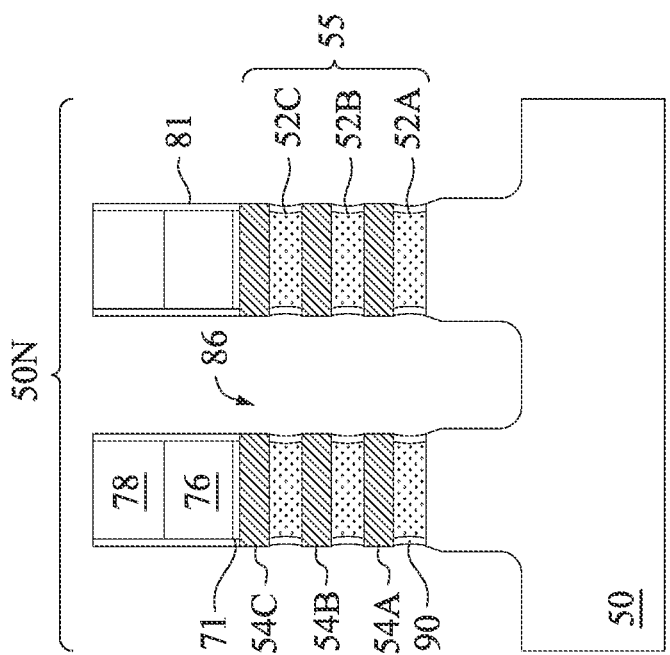

In FIGS. 11A-11C, first inner spacers 90 are formed in the sidewall recess 88. The first inner spacers 90 may be formed by depositing an inner spacer layer (not separately illustrated) over the structures illustrated in FIGS. 10A and 10B. The first inner spacers 90 act as isolation features between subsequently formed source/drain regions and a gate structure. As will be discussed in greater detail below, source/drain regions will be formed in the first recesses 86, while the first nanostructures 52 in the n-type region 50N and the second nanostructures 54 in the p-type region 50P will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54 in the n-type region 50N and flush with the sidewalls of the first nanostructures 52 in the p-type region 50P, the outer sidewalls of the first inner spacers 90 may extend beyond or be recessed from sidewalls of the second nanostructures 54 and/or the first nanostructures 52, respectively.

Moreover, although the outer sidewalls of the first inner spacers 90 are illustrated as being straight in FIG. 11B, the outer sidewalls of the first inner spacers 90 may be concave or convex. As an example, FIG. 11C illustrates an embodiment in which sidewalls of the first nanostructures 52 are concave, outer sidewalls of the first inner spacers 90 are concave, and the first inner spacers are recessed from sidewalls of the second nanostructures 54 in the n-type region 50N. Also illustrated are embodiments in which sidewalls of the second nanostructures 54 are concave, outer sidewalls of the first inner spacers 90 are concave, and the first inner spacers are recessed from sidewalls of the first nanostructures 52 in the p-type region 50P. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A-12H) by subsequent etching processes, such as etching processes used to form gate structures.

In FIGS. 12A-12H, epitaxial source/drain regions 92 (collectively referring to a first semiconductor material layer 92A, a second semiconductor material layer 92B, and a third semiconductor material layer 92C) are formed in the first recesses 86. In some embodiments, the epitaxial source/drain regions 92 may exert stress on the second nanostructures 54 in the n-type region 50N and on the first nanostructures 52 in the p-type region 50P, thereby improving performance. As illustrated in FIGS. 12B, 12D, 12F, and 12H the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the nanostructures 55 and may have facets.

The epitaxial source/drain regions 92 and the first nanostructures 52, and/or the substrate 50 may be implanted with dopants to form source/drain regions, similar to the process previously discussed for forming lightly-doped source/drain regions, followed by an anneal. The p-type dopants for source/drain regions may be any of the impurities previously discussed. In some embodiments, the epitaxial source/drain regions 92 may be in situ doped during growth.

Figure 12A:
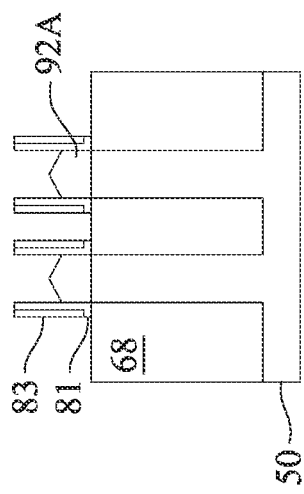
Figure 12B:
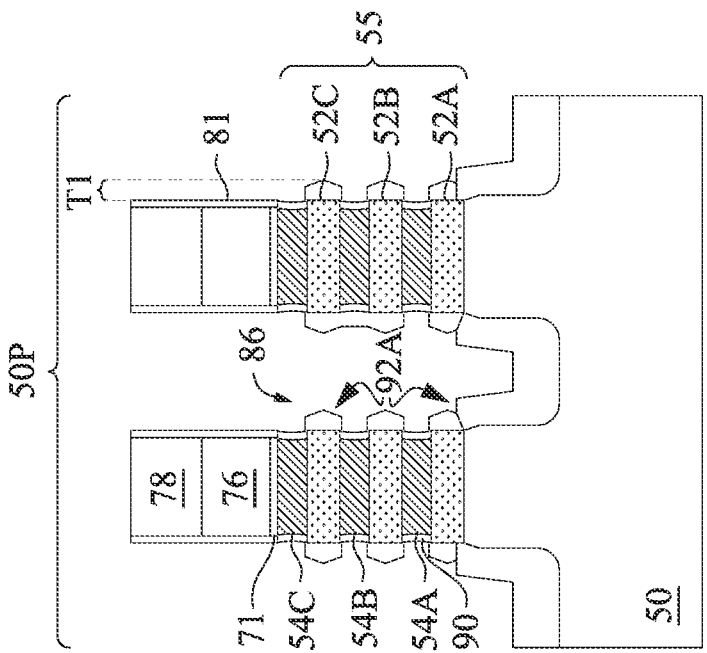
Figure 12B:
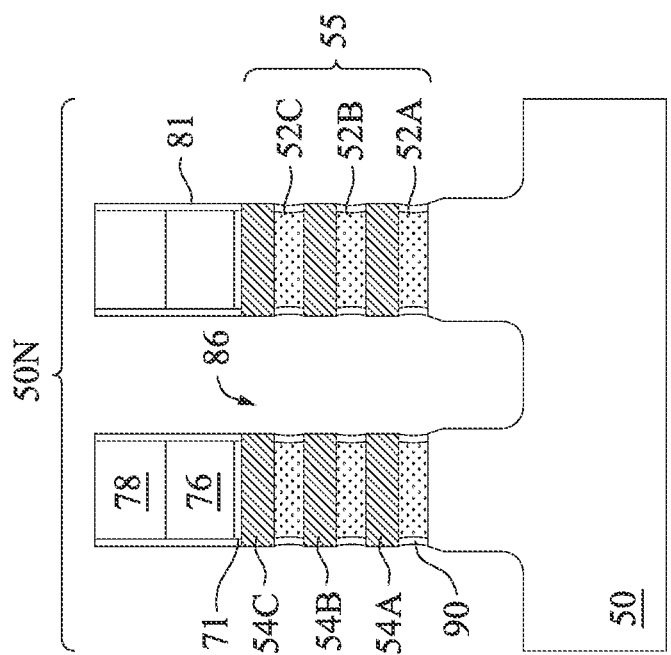

In the embodiment shown in FIGS. 12A and 12B, with respect to the p-type region 50P, a first semiconductor material layer 92A of epitaxial source/drain regions 92 is grown from the substrate and exposed portions of the first nanostructures 52 to a thickness T1 in a range of about 2 nanometers (nm) to about 6 nm. In this embodiment, the first semiconductor material layer 92A is formed from $Si_{1-x\_L1}Ge_{x\_L1}$, wherein x_L1 is between 0.1 and 0.4, such as 0.4, and doped with an impurity suitable for p-type source/drain regions, such as boron, with a doping concentration between $1\times10^{20}$ atoms/cm$^3$ and $5\times10^{20}$ atoms/cm$^3$, such as $5\times10^{20}$ atoms/cm$^3$.

In some embodiments a CVD process is used to epitaxially grow first semiconductor material layer 92A where nitrogen is used to purge an epitaxial reactor of air. The reactor is then heated to between 550° C. and 650° C. In some embodiments, after temperatures have stabilized in the range, a germanium-containing precursor gas such as germane (GeH$_4$), and a silicon-containing precursors such as silane (SiH$_4$), disilane (Si$_2$H$_6$), or dichlorosilane (DCS), are introduced into the reactor at a flow rate between 100 and 300 standard cubic centimeters per minute (sccm) for GeH$_4$, and at a flow rate between 20 and 150 sccm for DCS, SiH$_4$, or Si$_2$H$_6$, for between 2 and 5 minutes, to form a first semiconductor material layer 92A between about 2 nm and about 6 mn thick. In some embodiments, a carrier gas such as hydrogen, argon, or the like, is also added. In some embodiments, a boron-containing gas such as diborane (B$_2$H$_6$) is further injected into the reactor at a flow rate between 20 and 150 sccm. In some embodiments, the boron-containing gas is injected to achieve in-situ boron doping of the first semiconductor material layer 92A with a doping concentration between $1\times10^{20}$ atoms/cm$^3$ and $5\times10^{20}$ atoms/cm$^3$, such as $5\times10^{20}$ atoms/cm$^3$. In some embodiments, and etching gas such as hydrochloric acid (HCl) or chlorine (Cl$_2$) may be injected into the reactor with the process gases at a flow rate between 50 and 200 sccm to remove amorphous SiGe grown on dielectrics without significantly etching epitaxial SiGe as the etching rate will not exceed the deposition growth rate for the flow rates indicated.

In the embodiment shown in FIGS. 12C and 12D, a second semiconductor material layer 92B of epitaxial source/drain region 92 is grown up from the substrate 50, to cover the first semiconductor material layer 92A and substantially fill first recesses 86 in the p-type region 50P. In some embodiments, the second semiconductor material layer 92B is also formed from boron doped silicon-germanium, but with a doping concentration between $5\times10^{20}$ atoms/cm$^3$ and $10\times10^{20}$ atoms/cm$^3$, and greater than the doping concentration of the first semiconductor material layer 92A. In some embodiments the second semiconductor material layer 92B of epitaxial source/drain region 92 is grown through a CVD process controlling the concentration of germanium in the CVD process for a bottom-up growing pattern. Using such a bottom-up growing mechanism for the second semiconductor material layer 92B of epitaxial source/drain region 92 has been noted to achieve fewer stacking fault defects in epitaxial source/drain region 92. In some embodiments, the second semiconductor material layer 92B is $Si_{1-x\_L2}Ge_{x\_L2}$, wherein 0.2≤x_L2≤0.9, and with a germanium atomic percentage greater than that of the first semiconductor material layer 92A.

In some embodiments a CVD process is used to epitaxially grow the second semiconductor material layer 92B as a continuation of the epitaxial process for growing the first semiconductor material layer 92A, where the temperatures and flow rates of the component gases are controlled to achieve a bottom-up growth of the second semiconductor material layer 92B. In some embodiments, the reactor temperature is changed to between 550° C. and 650° C., the precursor gas GeH$_4$ flow rate is set between 100 and 500 sccm, and precursor gases DCS, SiH$_4$ or Si$_2$H$_6$ are sequentially pulsed into the chamber at a flow rate between 20 and 50 sccm for between 3 and 5 minutes to grow the second semiconductor material layer 92B in a bottom-up manner. In some embodiments, a boron-containing gas such as B$_2$H$_6$ is further injected into the reactor at a flow rate between 150 and 300 sccm. In some embodiments, the boron-containing gas is injected to achieve in-situ boron doping of the second semiconductor material layer 92B with a doping concentration between $5\times10^{20}$ atoms/cm$^3$ and $10\times10^{20}$ atoms/cm$^3$, and greater than the doping concentration of the first semiconductor material layer 92A In some embodiments, and etching gas such as HCl or Cl$_2$ may be injected into the reactor at a flow rate between 150 and 250 sccm to remove amorphous SiGe grown on dielectrics without etching epitaxial SiGe as the etching rate will not exceed the deposition rate for the flow rates indicated.

In some embodiments, as shown in FIGS. 12E and 12F, further layers of semiconductor material, for example, a third semiconductor material layer 92C is grown over the second semiconductor material layer 92B to complete the formation of epitaxial source/drain regions 92 in the p-type region 50P. These further layers of semiconductor material may be formed from $Si_{1-x\_L3}Ge_{x\_L3}$, wherein 0.1≤x_L3≤0.25, and lower than that of the first semiconductor material layer 92A. In some embodiments the further layers of semiconductor material may be formed of other materials than that used to grow the first semiconductor material layer 92A and second semiconductor material layer 92B. In some embodiments the third semiconductor material layer 92C is 2 to 4 nm thick and acts as a protective barrier for the second semiconductor material layer 92B during subsequent wet etches.

In some embodiments a CVD process is used to epitaxially grow the subsequent third semiconductor material layer 92C as a continuation of the epitaxial process for growing the second semiconductor material layer 92B and first semiconductor material layer 92A. In some embodiments, the reactor temperature is changed to between 580° C. and 650° C., the precursor gas GeH$_4$ flow rate is set between 150 and 300 sccm, and precursor gas DCS flow rate is set between 30 and 50 sccm for between 2 and 4 minutes to grow the subsequent third semiconductor material layer 92C, and finish growing epitaxial source/drain region 92. In some embodiments, a boron-containing gas such as B$_2$H$_6$ is further injected into the reactor at a flow rate between 20 and 80 sccm. In some embodiments, the boron-containing gas is injected to achieve in-situ boron doping of the third semiconductor material layer 92C with a doping concentration of between $6\times10^{19}$ atoms/cm$^3$ and $2\times10^{20}$ atoms/cm$^3$, and lower than that of the first semiconductor material layer 92A. In some embodiments, and etching gas such as HCl or Cl$_2$ may be injected into the reactor at a flow rate between 50 and 100 sccm to remove amorphous SiGe grown on dielectrics without etching epitaxial SiGe as the etching rate will not exceed the deposition rate for the flow rates indicated.

As discussed in greater detail below, the epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, carbon-doped silicon (SiC), phosphorous and carbon doped silicon (SiCP), silicon phosphide (SiP), or the like. The epitaxial source/drain regions 92 may have surfaces raised from respective upper surfaces of the nanostructures 55 and may have facets.

In some embodiments a CVD process is used to epitaxially grow first semiconductor material layer 92A in the n-type region 50N, where nitrogen is used to purge an epitaxial reactor of air. The reactor is then heated to between 580° C. and 700° C. In some embodiments, after temperatures have stabilized in the range, a carbon-containing precursor gas such as propane (C$_3$H$_8$) and ethylene (C$_2$H$_4$), and a silicon-containing precursor such as DCS, SiH$_4$, or Si$_2$H$_6$, are introduced into the reactor. In an embodiment where C$_3$H$_8$ or C$_2$H$_4$ and DCS, SiH$_4$, or Si$_2$H$_6$, are the precursor gasses used, C$_3$H$_8$ or C$_2$H$_4$ is injected into the reactor at a flow rate between 20 and 250 sccm, and DCS, SiH$_4$, or Si$_2$H$_6$, is injected at a flow rate between 100 and 900 sccm, for between 1 and 10 minutes, to form a first semiconductor material layer 92A between 2 nm and 6 mn thick. In some embodiments, a carrier gas such as hydrogen, argon, or the like is also added. In some embodiments, a phosphorous-containing gas such as phosphine (PH$_3$) is further injected into the reactor at a flow rate between 50 and 300 sccm. In some embodiments, the phosphorous-containing gas is injected to achieve in-situ phosphorous doping of the first semiconductor material layer 92A with a doping concentration between 1×10$^{20}$ atoms/cm$^3$ and 4×10$^{20}$ atoms/cm$^3$, such as 4×10$^{20}$ atoms/cm$^3$ In some embodiments, and etching gas such as HCl or Cl$_2$ may be injected into the reactor at a flow rate between 20 and 150 sccm to remove amorphous SiC grown on dielectrics without significantly etching epitaxial SiC as the etching rate will not exceed the deposition growth rate for the flow rates indicated.

A second semiconductor material layer 92B of epitaxial source/drain region 92 is grown up from the substrate 50, to cover the first semiconductor material layer 92A and substantially fill first recesses 86 in the n-type region 50N. In some embodiments, the second semiconductor material layer 92B is also formed from phosphorous and carbon doped silicon, but with a phosphorous doping concentration greater than 7×10$^{20}$ atoms/cm$^3$, and greater than the phosphorous doping concentration of the first semiconductor material layer 92A. In some embodiments the second semiconductor material layer 92B of epitaxial source/drain region 92 is grown through a CVD process controlling the concentration of carbon in the CVD process for a bottom-up growing pattern. Using such a bottom-up growing mechanism for the second semiconductor material layer 92B of epitaxial source/drain region 92 has been noted to achieve fewer stacking fault defects in epitaxial source/drain region 92 of the n-type region 50N. In some embodiments, the second semiconductor material layer 92B is Si$_{1-x\_L2}$C$_{x\_L2}$, wherein 0.2≤x_L2≤0.9, and with a carbon atomic percentage greater than that of the first semiconductor material layer 92A.

In some embodiments a CVD process is used to epitaxially grow the second semiconductor material layer 92B as a continuation of the epitaxial process for growing the first semiconductor material layer 92A, where the temperatures and flow rates of the component gases are controlled to ensure a bottom-up growth of the second semiconductor material layer 92B. In some embodiments, the reactor temperature is changed to between 580° C. and 700° C., the precursor gas C$_3$H$_8$ or C$_2$H$_4$ flow rate is set between 100 and 250 sccm, and precursor gas DCS, SiH$_4$, or Si$_2$H$_6$, flow rate is set between 100 and 900 sccm for between 5 and 15 minutes to grow the second semiconductor material layer 92B in a bottom-up manner. In some embodiments, a phosphorous-containing gas such as PH$_3$ is further injected into the reactor at a flow rate between 50 and 500 sccm. In some embodiments, the phosphorous—containing gas is injected to achieve in-situ phosphorous doping of the second semiconductor material layer 92B with a phosphorous doping concentration greater than 7×10$^{20}$ atoms/cm$^3$, and greater than the phosphorous doping concentration of the first semiconductor material layer 92A In some embodiments, and etching gas such as HCl or Cl$_2$ may be injected into the reactor at a flow rate between 20 and 200 sccm to remove amorphous SiC grown on dielectrics without etching epitaxial SiC as the etching rate will not exceed the deposition rate for the flow rates indicated.

In some embodiments, further layers of semiconductor material, for example, a third semiconductor material layer 92C is grown over the second semiconductor material layer 92B to complete the formation of epitaxial source/drain regions 92 in the n-type region 50N. These further layers of semiconductor material may be formed from Si$_{1-x\_L3}$C$_{x\_L3}$, wherein 0≤x_L3≤10. In some embodiments the further layers of semiconductor material may be formed of other materials than that used to grow the first semiconductor material layer 92A and second semiconductor material layer 92B.

In some embodiments a CVD process is used to epitaxially grow the subsequent third semiconductor material layer 92C as a continuation of the epitaxial process for growing the second semiconductor material layer 92B and first semiconductor material layer 92A. In some embodiments, the reactor temperature is changed to between 580° C. and 900° C., the precursor gas C$_3$H$_8$ or C$_2$H$_4$ flow rate is set between 20 and 100 sccm, and precursor gas DCS, SiH$_4$, or Si$_2$H$_6$, flow rate is set between 50 and 500 sccm, for between 10 and 20 minutes to grow the subsequent third semiconductor material layer 92C, and finish growing epitaxial source/drain region 92. In some embodiments, a phosphorous-containing gas such as PH$_3$ is further injected into the reactor at a flow rate between 20 and 100 sccm. In some embodiments, the phosphorous-containing gas is injected to achieve in-situ phosphorous doping of the third semiconductor material layer 92C with a phosphorous doping concentration of between 1×10$^{20}$ atoms/cm$^3$ and 4×10$^{20}$ atoms/cm$^3$ In some embodiments, and etching gas such as HCl or Cl$_2$ may be injected into the reactor at a flow rate between 50 and 200 sccm to remove amorphous SiC grown on dielectrics without etching epitaxial SiC as the etching rate will not exceed the deposition rate for the flow rates indicated.

The end-wall shape of the first nanostructures 52 in the p-type region 50P or the second nanostructures 54 in the n-type region 50N are shown as being rectangular for illustrative purposes. In some embodiments, the end-wall shapes of the first nanostructures 52 in the p-type region 50P and/or the second nanostructures 54 in the n-type region 50N may be other shapes, such as convex (FIG. 12I) or concave (FIG. 12J), or any other shape.

Using the above outlined process, it has been noted that the first semiconductor material layer 92A is less likely to merge over the first inner spacers 90 between adjacent first nanostructures 52, such that the first semiconductor layer 92A comprises a plurality of segments as illustrated in FIG. 12B. For example, partial non-merger may be achieved, as shown on the right pillar of the p-type region 50P in FIG. 12B where the first semiconductor material layer 92A has only merged across first inner spacer 90 on the left side of 52C and 52B. Alternatively, full non-merger may be achieved, such as is shown on the left pillar of the p-type region 50P in FIG. 12B where no merger of the first semiconductor material layer 92A is shown across any first inner spacer 90. By reducing or preventing the merger of the first semiconductor material layer 92A, the second semiconductor material layer 92B will have a larger volume for the same semiconductor design, thus reducing the resistivity of the epitaxial source/drain region 92 overall. Further, the process has been shown to result in fewer defect stacking fault creations in epitaxial source/drain region 92 than if a bottom-up growth process was not used. By minimizing or reducing defect stacking faults and reducing mergers of the first semiconductor material layer 92A across first inner spacers 90 to increase the volume of the second semiconductor material layer 92B, the nano-FETs exhibit lower resistivity, and higher current carrying capacity, from the epitaxial source/drain region 92, to the channel formed by the first nanostructures 52 (in the p-type region 50P) and second nanostructures 54 (in the n-type region 50N). Thus, the nano-FET capacity and electrical performance is improved.

Figure 12G:
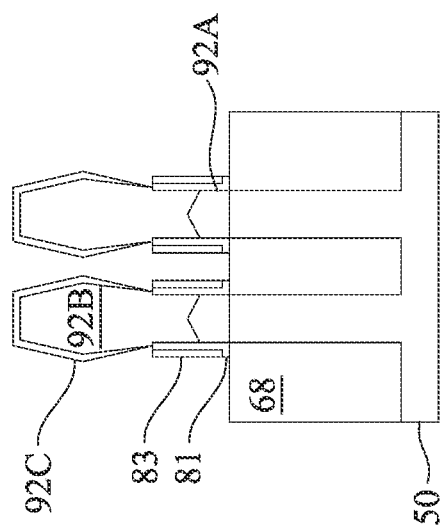

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same NSFET to merge as illustrated by FIGS. 12C and 12E. In other embodiments, adjacent epitaxial source/drain regions 92 remain separated after the epitaxy process is completed as illustrated by FIG. 12G. In the embodiments illustrated in FIGS. 12A, 12C, 12E, and 12G, the first spacers 81 may be formed to a top surface of the isolation regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the isolation region 68.

Figure 12H:
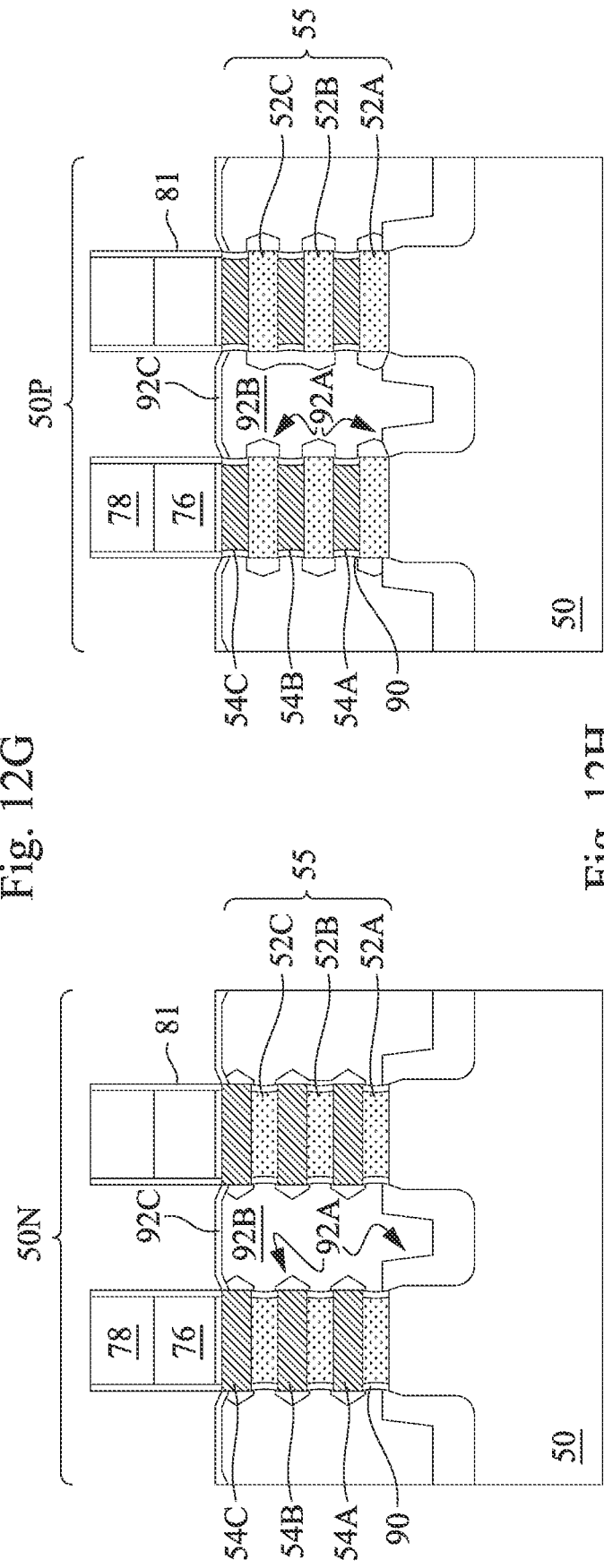
Figure 12I:
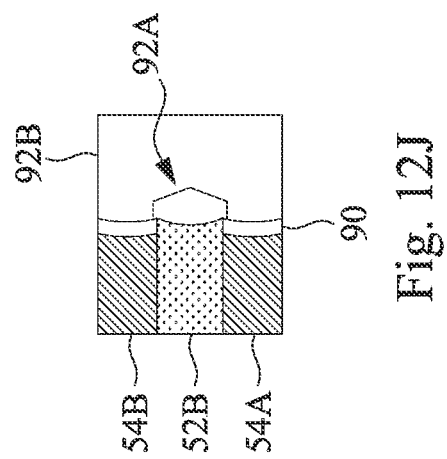
Figure 12J:
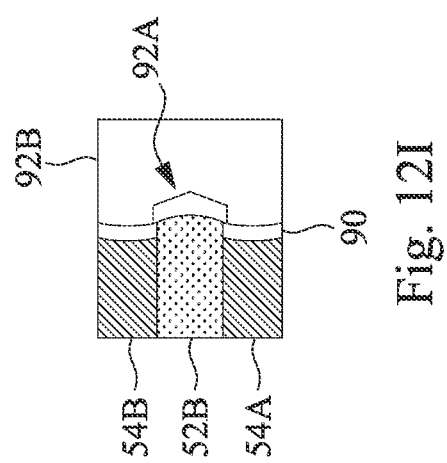

FIG. 12H illustrates an embodiment in which sidewalls of the first nanostructures 52 in the n-type region 50N and sidewalls of the second nanostructures 54 in the p-type region 50P are concave, outer sidewalls of the first inner spacers 90 are concave, and the first inner spacers 90 are recessed from sidewalls of the second nanostructures 54 and the first nanostructures 52, respectively. As illustrated in FIG. 12H, the epitaxial source/drain regions 92 may be formed in contact with the first inner spacers 90 and may extend past sidewalls of the second nanostructures 54 in the n-type region 50N and past sidewalls of the first nanostructures 52 in the p-type region 50P.

Figure 13A:
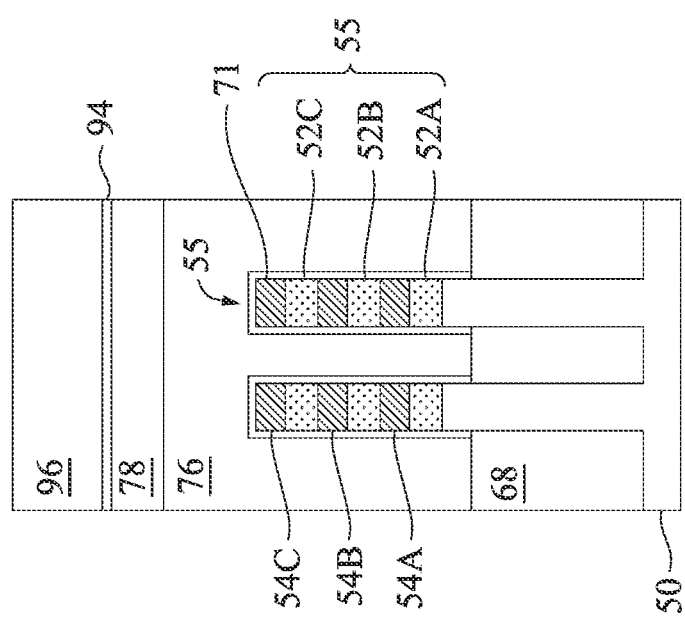
Figure 13B:
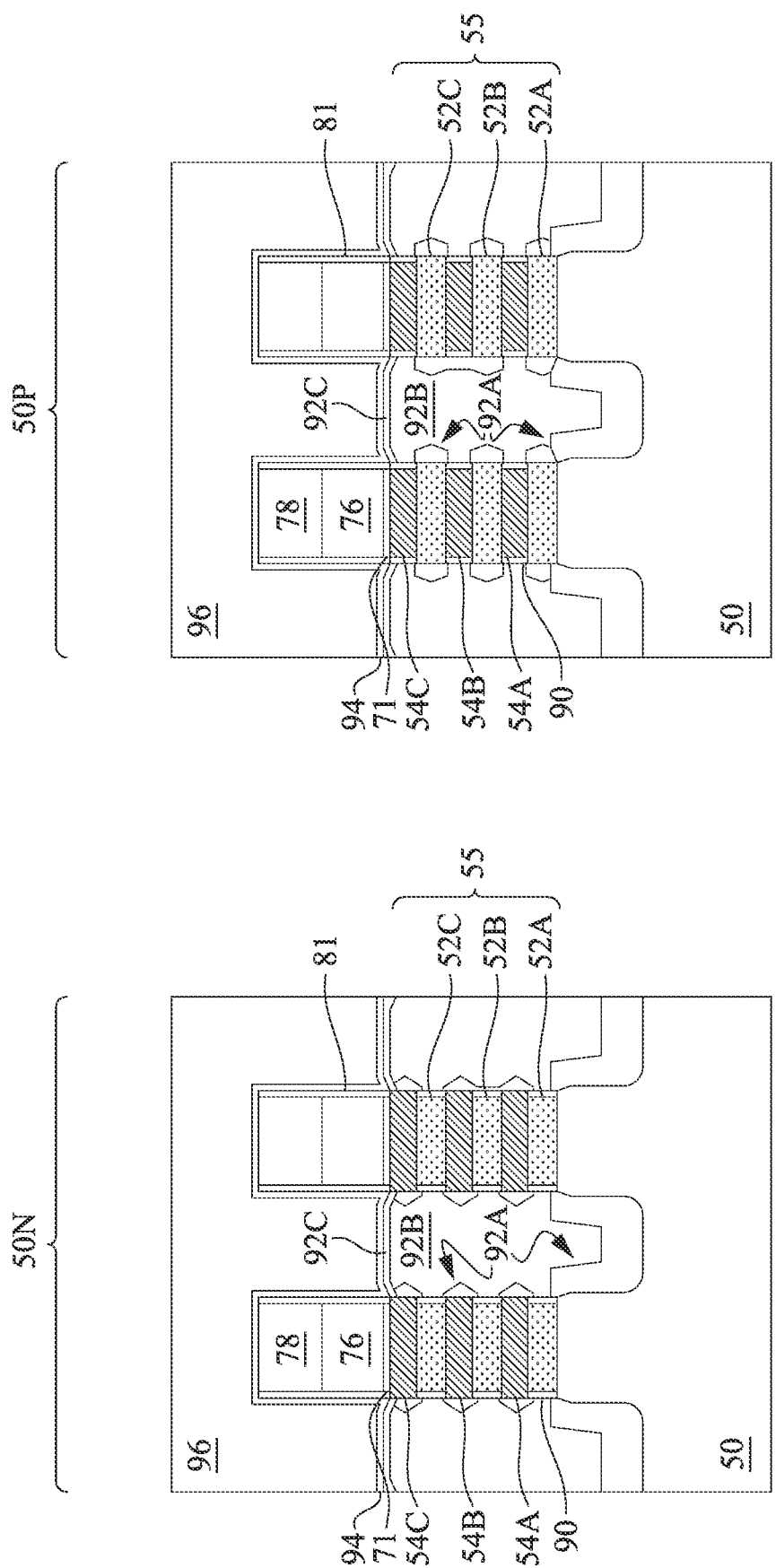
Figure 13C:
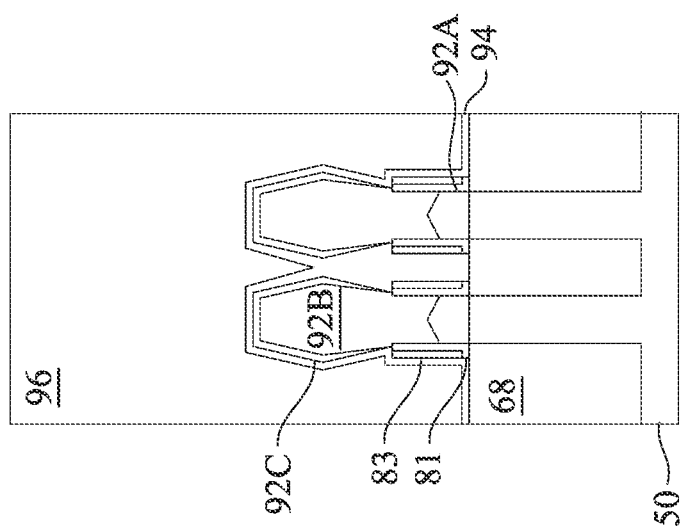

In FIGS. 13A-13C, a first interlayer dielectric (ILD) 96 is deposited over the structure illustrated in FIGS. 6A, 12H, and 12G (the processes of FIGS. 7A-12H do not alter the cross-section illustrated in FIGS. 6A), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the mask 78, and the first spacers 81. The CESL 94 may comprise a dielectric material, such as, silicon nitride, silicon oxide, silicon oxynitride, or the like, having a different etch rate than the material of the overlying first ILD 96.

In FIGS. 14A-14C, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gate 76 are exposed through the first ILD 96. In some embodiments, the masks 78 may remain, in which case the planarization process levels the top surface of the first ILD 96 with top surface of the masks 78 and the first spacers 81.

Figure 15A:
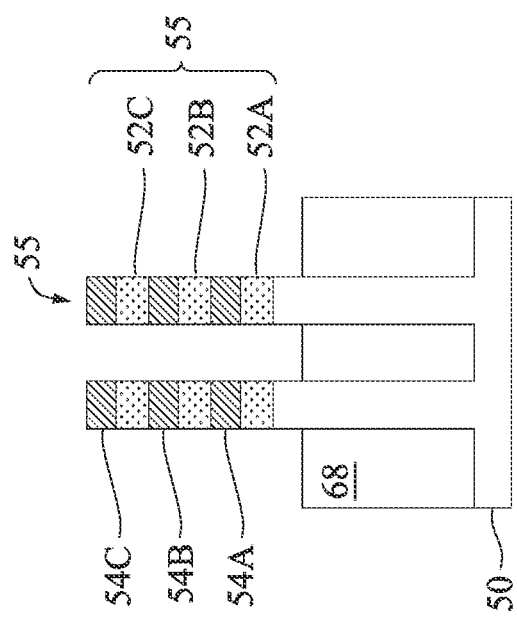
Figure 15B:
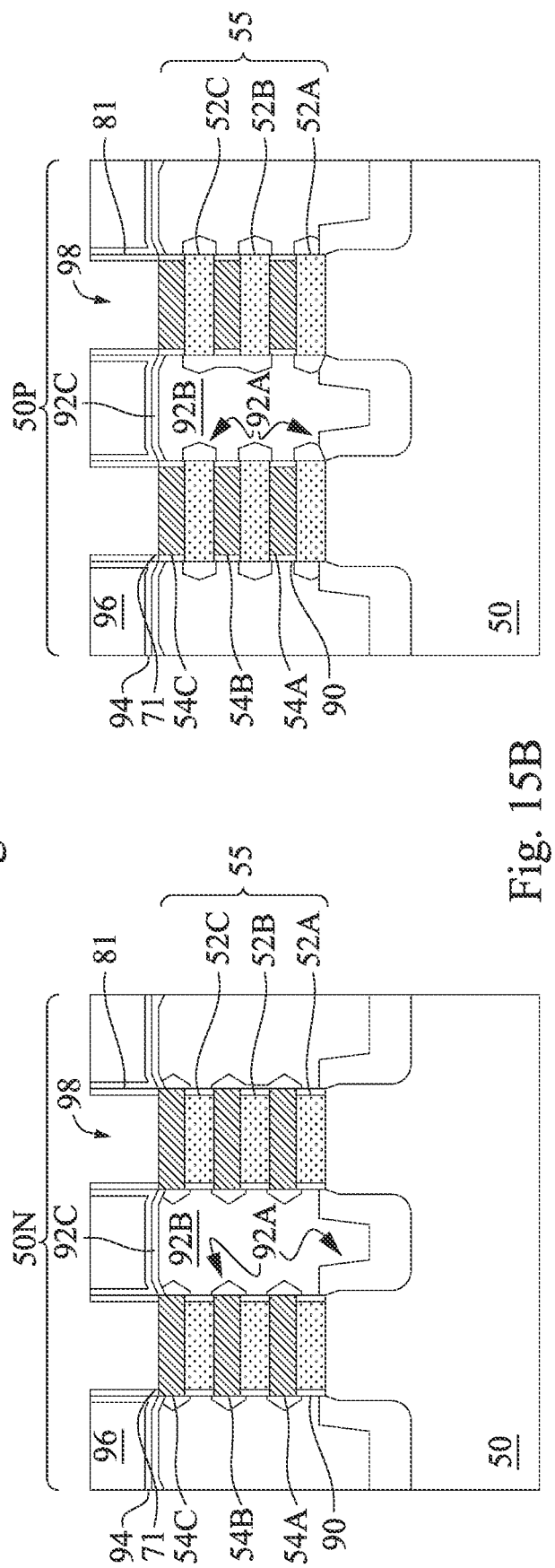

In FIGS. 15A and 15B, the dummy gate 76, and the mask 78 if present, are removed in one or more etching steps, so that second recesses 98 are formed. Portions of the dummy gate dielectrics 71 in the second recesses 98 are also be removed. In some embodiments, the dummy gate 76 and the dummy dielectrics layers 60 are removed by an anisotropic dry etch process. For example, the etching process may include a dry etch process using reaction gas(es) that selectively etch the dummy gate 76 at a faster rate than the first ILD 96 or the first spacers 81. Each second recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy dielectric layers 60 may be used as etch stop layers when the dummy gate 76 is etched. The dummy dielectric layers 60 may then be removed after the removal of the dummy gate 76.

Figure 16A:
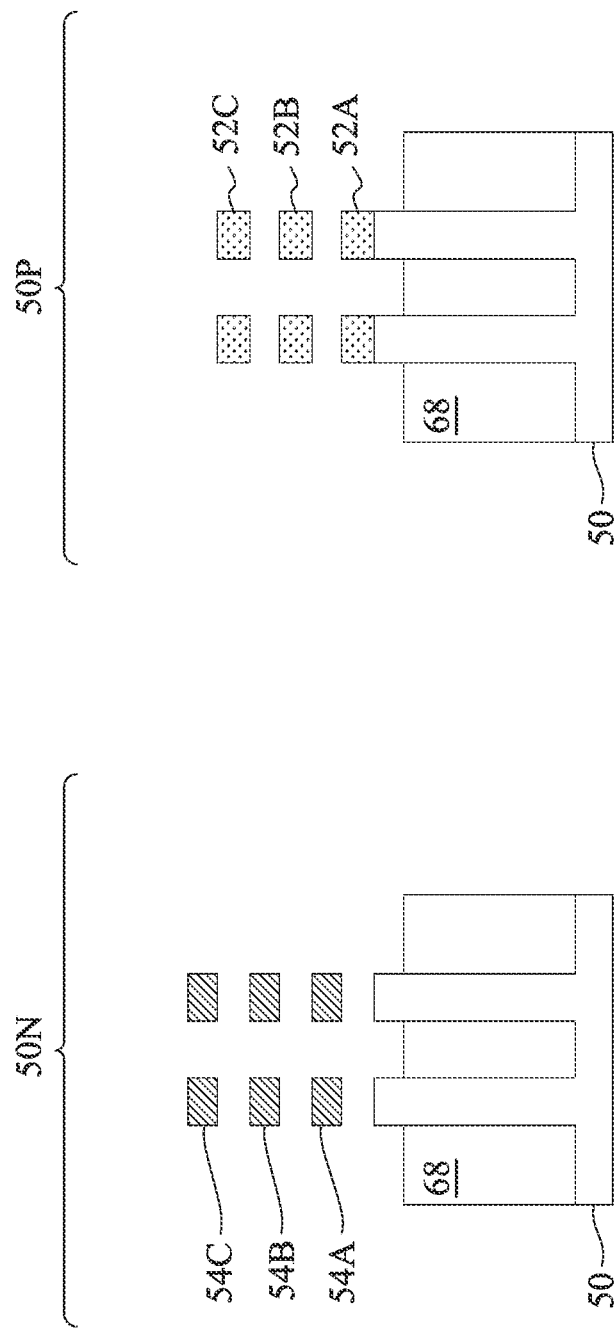
Figure 16B:
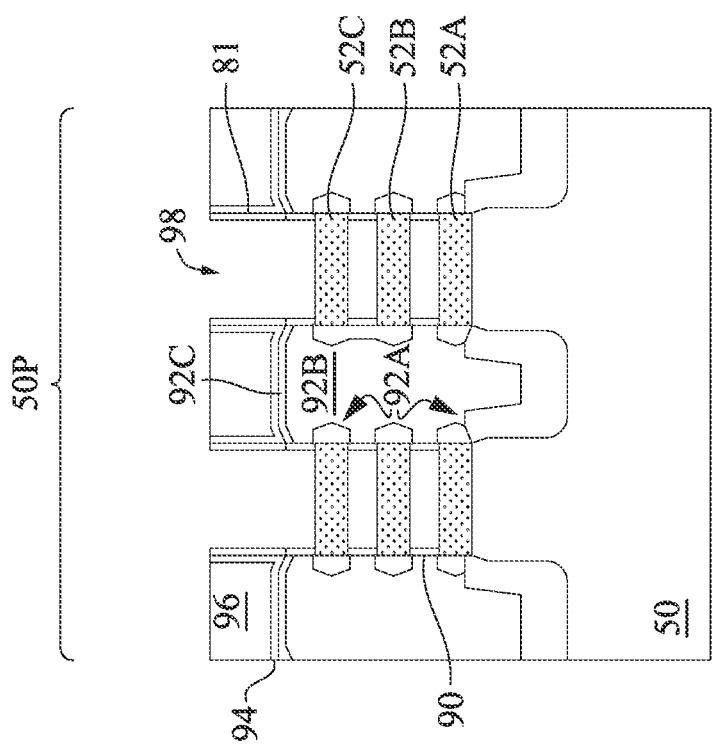
Figure 16B:
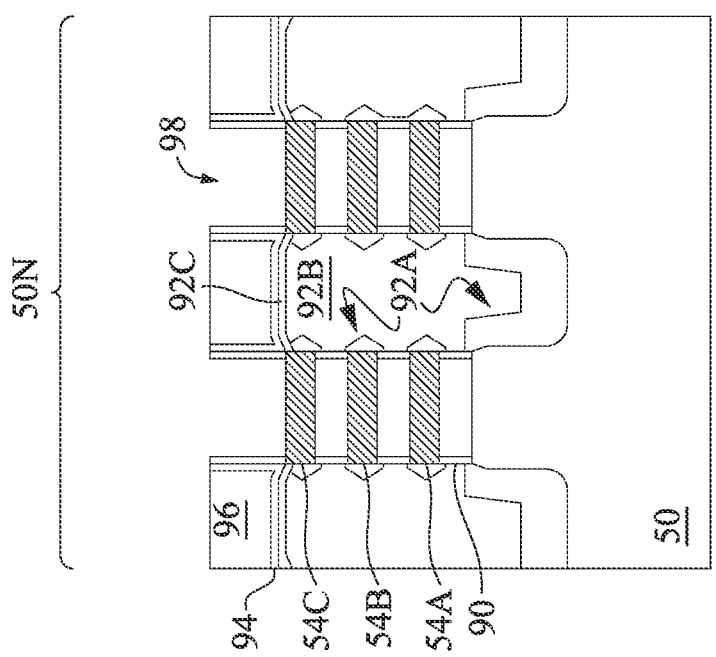

In FIGS. 16A and 16B, the first nanostructures 52 in the n-type region 50N and the second nanostructures 54 in the p-type region 50P are removed extending the second recesses 98. The first nanostructures 52 may be removed by forming a mask (not shown) over the p-type region 50P and performing an isotropic etching process such as wet etching or the like using etchants which are selective to the materials of the first nanostructures 52, while the second nanostructures 54, the substrate 50, the isolation regions 68 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide ($NH_4OH$), or the like may be used to remove the first nanostructures 52 in the n-type region 50N.

The second nanostructures 54 in the p-type region 50P may be removed by forming a mask (not shown) over the n-type region 50N and performing an isotropic etching process such as wet etching or the like using etchants which are selective to the materials of the second nanostructures 54, while the first nanostructures 52, the substrate 50, the isolation regions 68 remain relatively unetched as compared to the second nanostructures 54. In embodiments in which the second nanostructures 54 include, e.g., SiGe, and the first nanostructures 52 include, e.g., Si or SiC, hydrogen fluoride, another fluorine-based gas, or the like may be used to remove the second nanostructures 54 in the p-type region 50P.

Figure 17A:
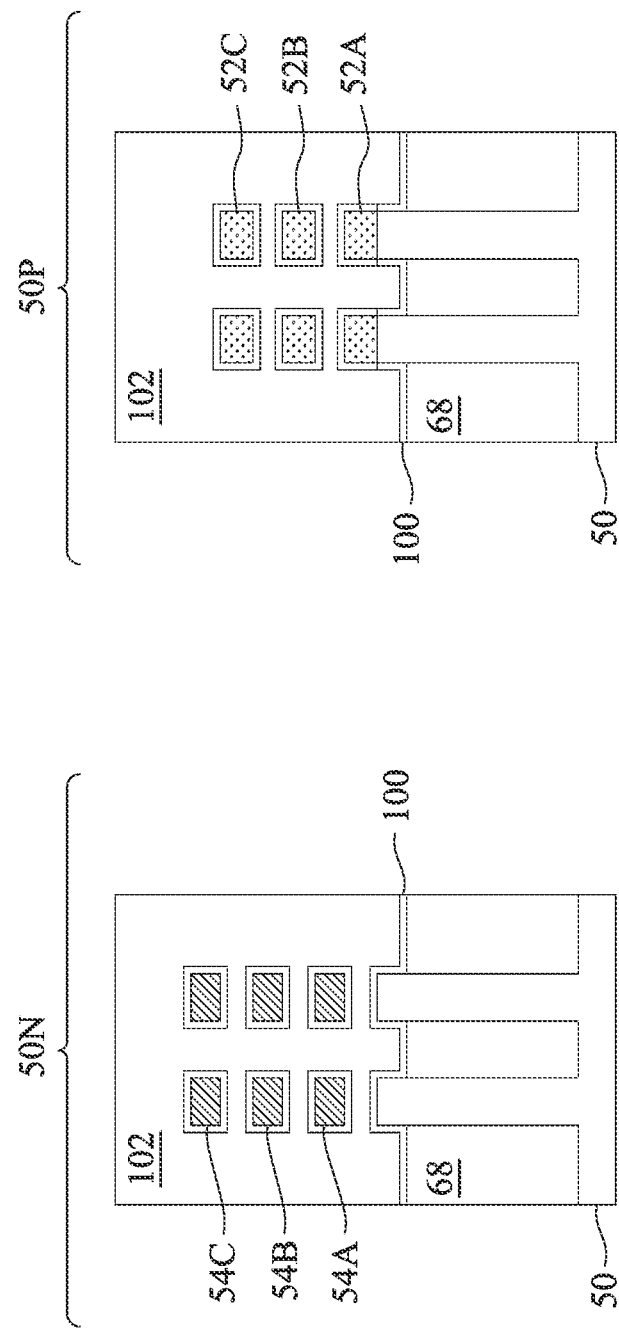
Figure 17B:
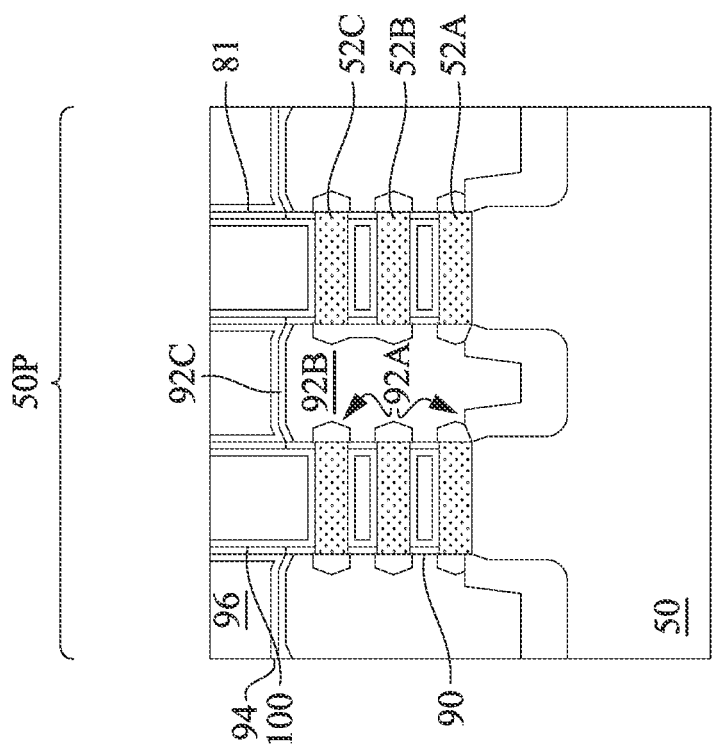
Figure 17B:
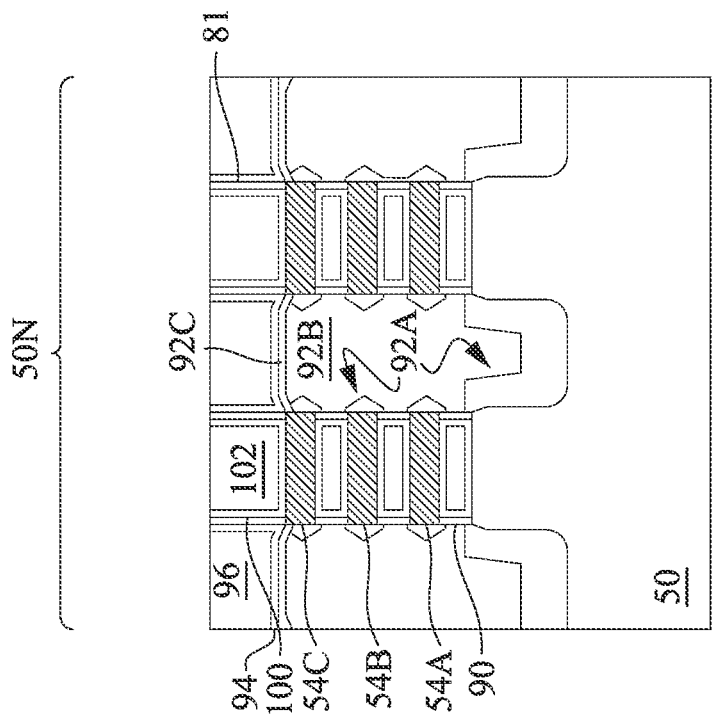

In FIGS. 17A and 17B, gate dielectric layers 100 and gate electrodes 102 are formed for replacement gates. The gate dielectric layers 100 are deposited conformally in the second recesses 98. In the n-type region 50N, the gate dielectric layers 100 may be formed on top surfaces and sidewalls of the substrate 50 and on top surfaces, sidewalls, and bottom surfaces of the second nanostructures 54, and in the p-type region 50P, the gate dielectric layers 100 may be formed on top surfaces and sidewalls of the substrate 50 and on top surfaces, sidewalls, and bottom surfaces of the first nanostructures 52. The gate dielectric layers 100 may also be deposited on top surfaces of the first ILD 96, the CESL 94, the first spacers 81, and the isolation regions 68.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 17A and 17B, the gate electrodes 102 may comprise any number of liner layers, any number of work function tuning layers, and a fill material. Any combination of the layers which make up the gate electrodes 102 may be deposited in the n-type region 50N between adjacent ones of the second nanostructures 54 and between the second nanostructure 54A and the substrate 50, and may be deposited in the p-type region 50P between adjacent ones of the first nanostructures 52.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the second recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 18A:
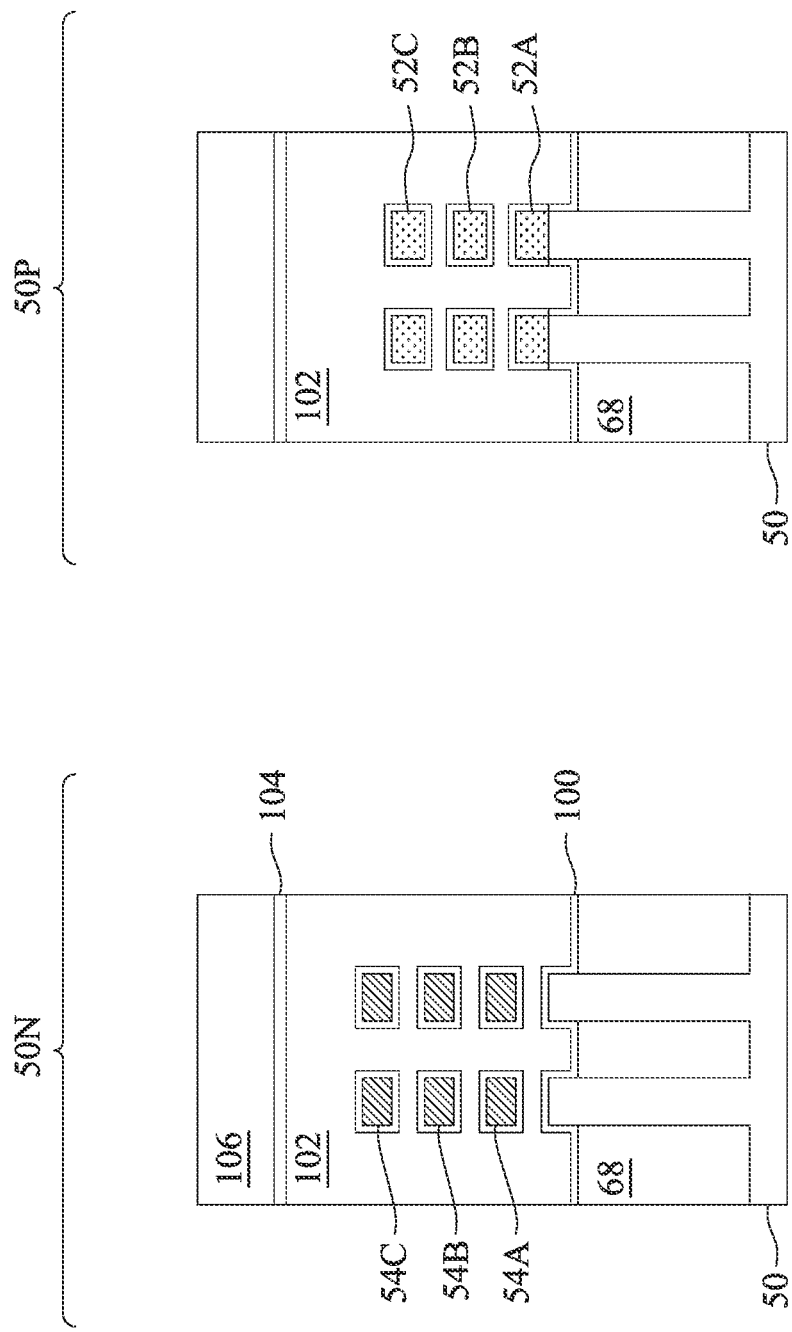
Figure 18B:
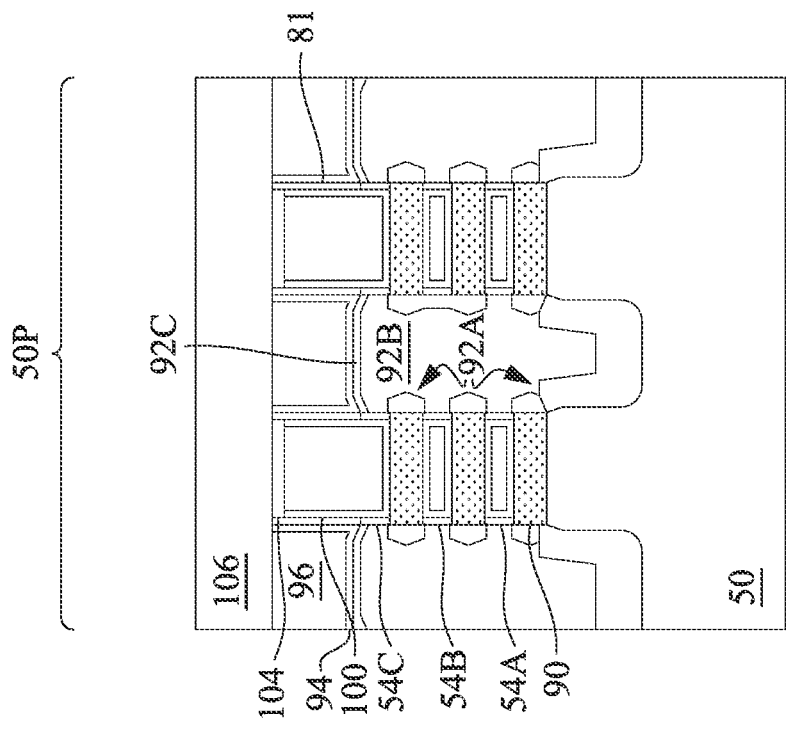
Figure 18B:
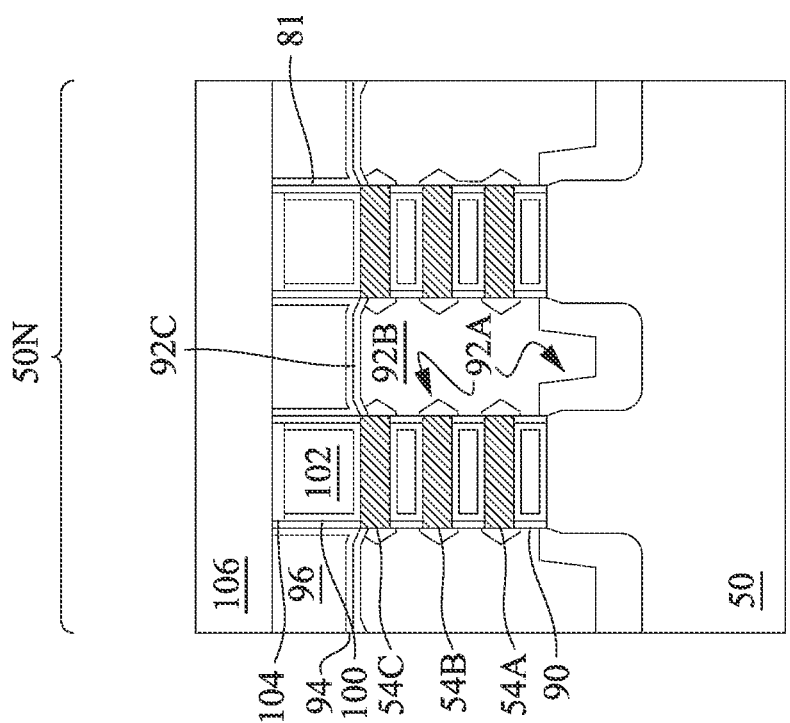
Figure 18C:
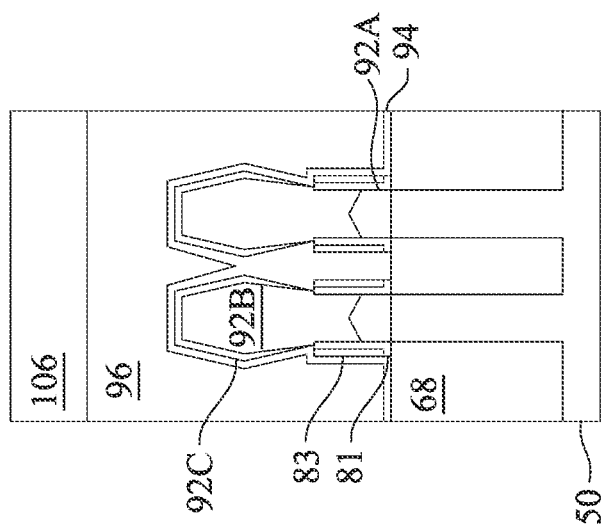

In FIGS. 18A-18C, the gate structure (including the gate dielectric layers 100 and the corresponding overlying gate electrodes 102) is recessed, so that a recess is formed directly over the gate structure and between opposing portions of first spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 114, discussed below with respect to FIGS. 23A and 23B) penetrate through the gate mask 104 to contact the top surface of the recessed gate electrodes 102.

As further illustrated by FIGS. 18A-18C, a second ILD 106 is deposited over the first ILD 96 and over the gate mask 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 19A:
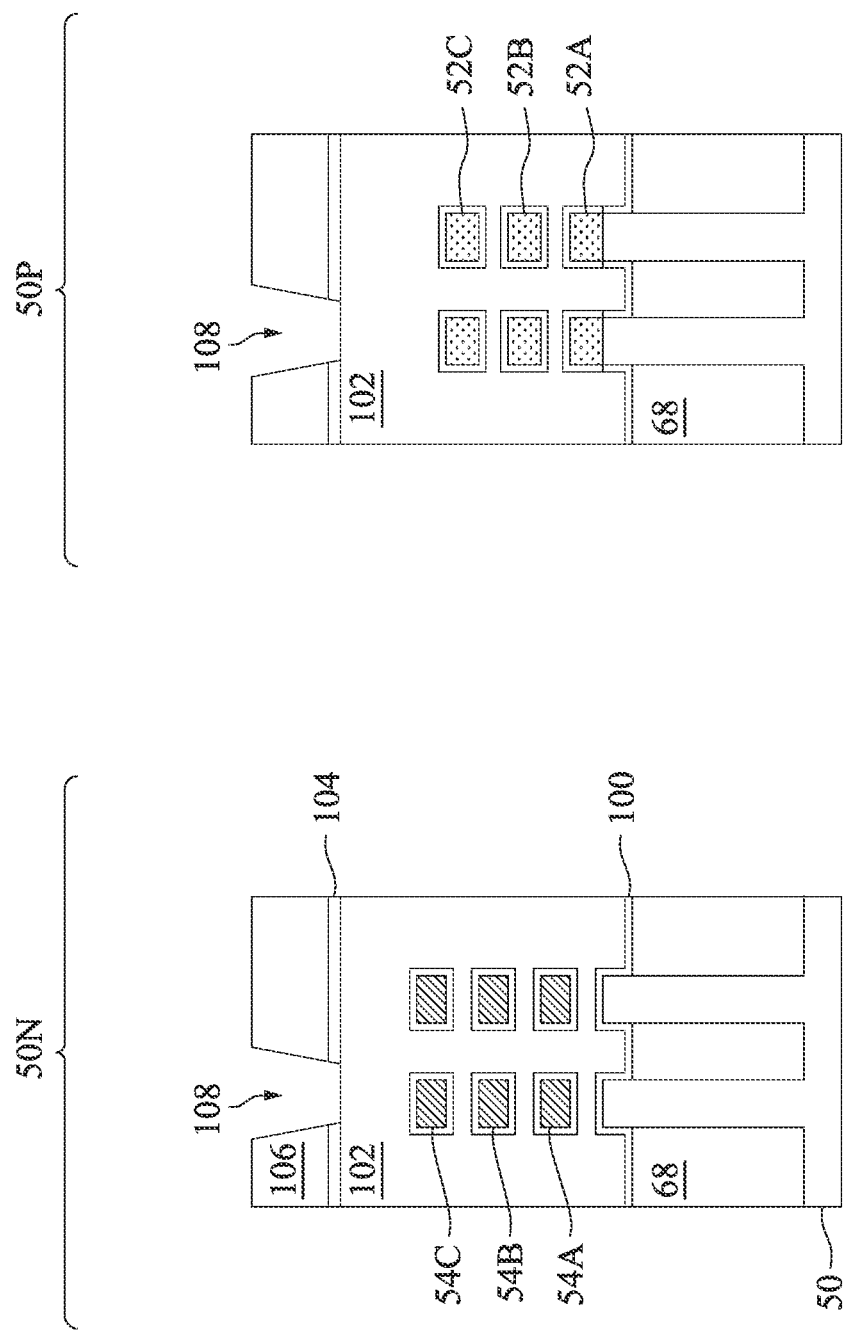
Figure 19B:
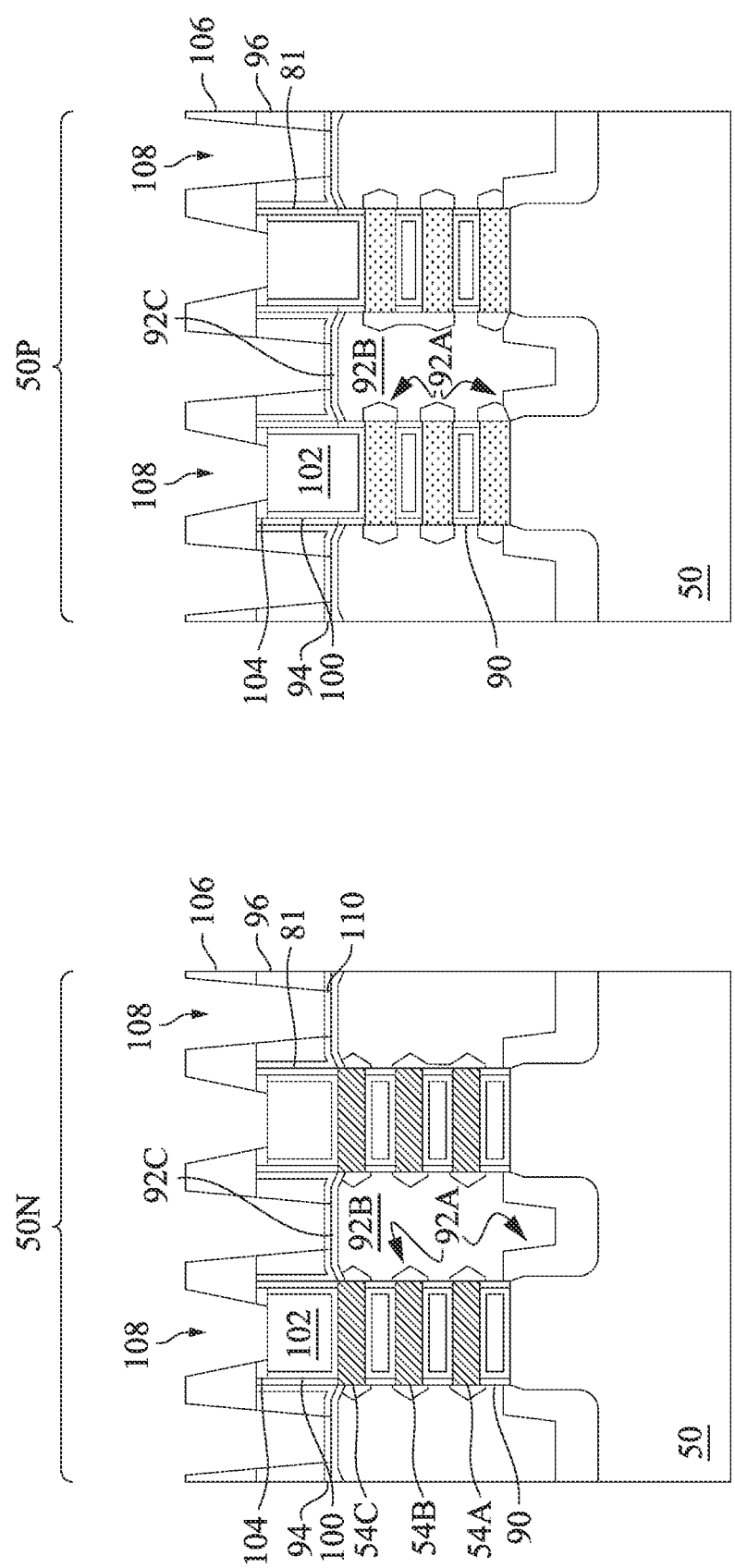
Figure 19C:
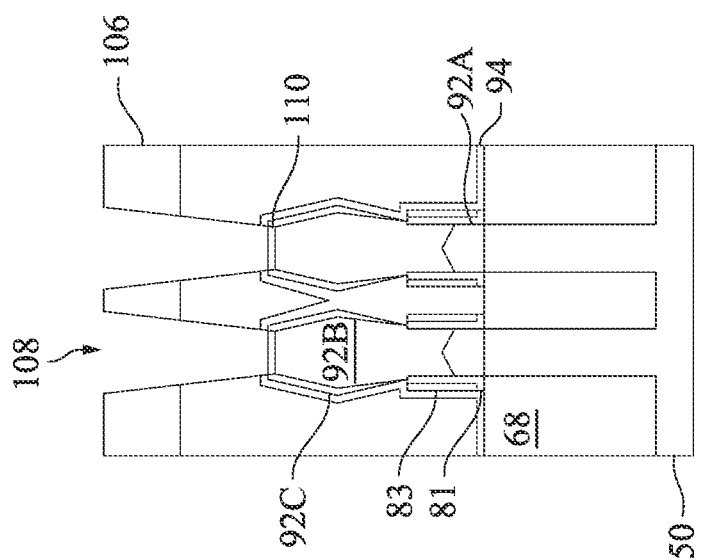

In FIGS. 19A-19C, the second ILD 106, the first ILD 96, the CESL 94, and the gate masks 104 are etched to form third recesses 108 exposing surfaces of the epitaxial source/drain regions 92 and/or the gate structure. The third recesses 108 may be formed by etching using an anisotropic etching process, such as RIE, NBE, or the like. In some embodiments, the third recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the third recesses 108 extend into the epitaxial source/drain regions 92 and/or the gate structure, and a bottom of the third recesses 108 may be level with (e.g., at a same level, or having a same distance from the substrate), or lower than (e.g., closer to the substrate) the epitaxial source/drain regions 92 and/or the gate structure. Although FIG. 19B illustrate the third recesses 108 as exposing the epitaxial source/drain regions 92 and the gate structure in a same cross section, in various embodiments, the epitaxial source/drain regions 92 and the gate structure may be exposed in different cross-sections, thereby reducing the risk of shorting subsequently formed contacts. After the third recesses 108 are formed, silicide regions 110 are formed over the epitaxial source/drain regions 92. In some embodiments, the silicide regions 110 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 110. The un-reacted portions of the deposited metal are then removed, e.g., by an etching process. Although silicide regions 110 are referred to as silicide regions, silicide regions 110 may also be germanide regions, or silicon germanide regions (e.g., regions comprising silicide and germanide). In an embodiment, the silicide region 110 comprises TiSi, and has a thickness in a range between about 2 nm and about 10 nm.

Figure 20A:
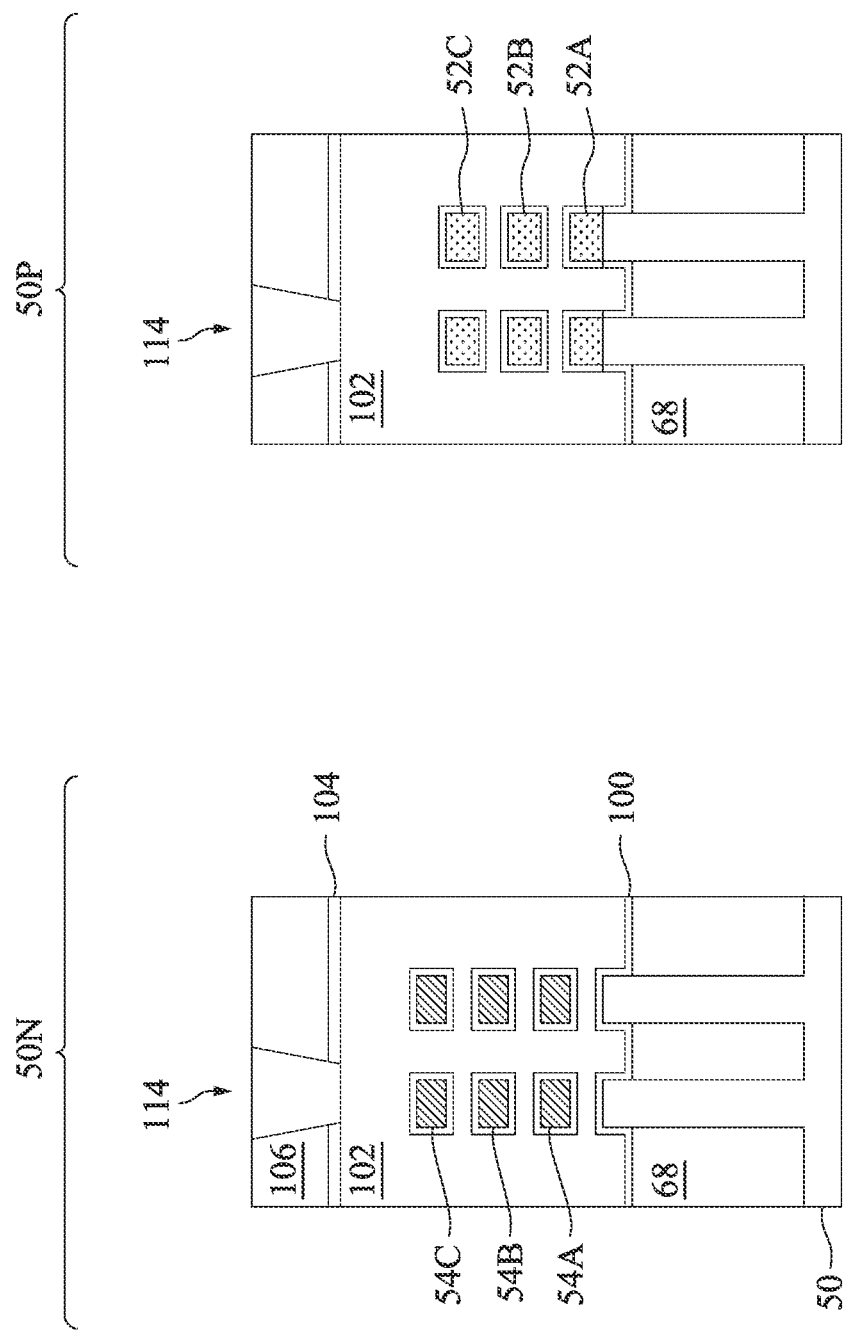
Figure 20B:
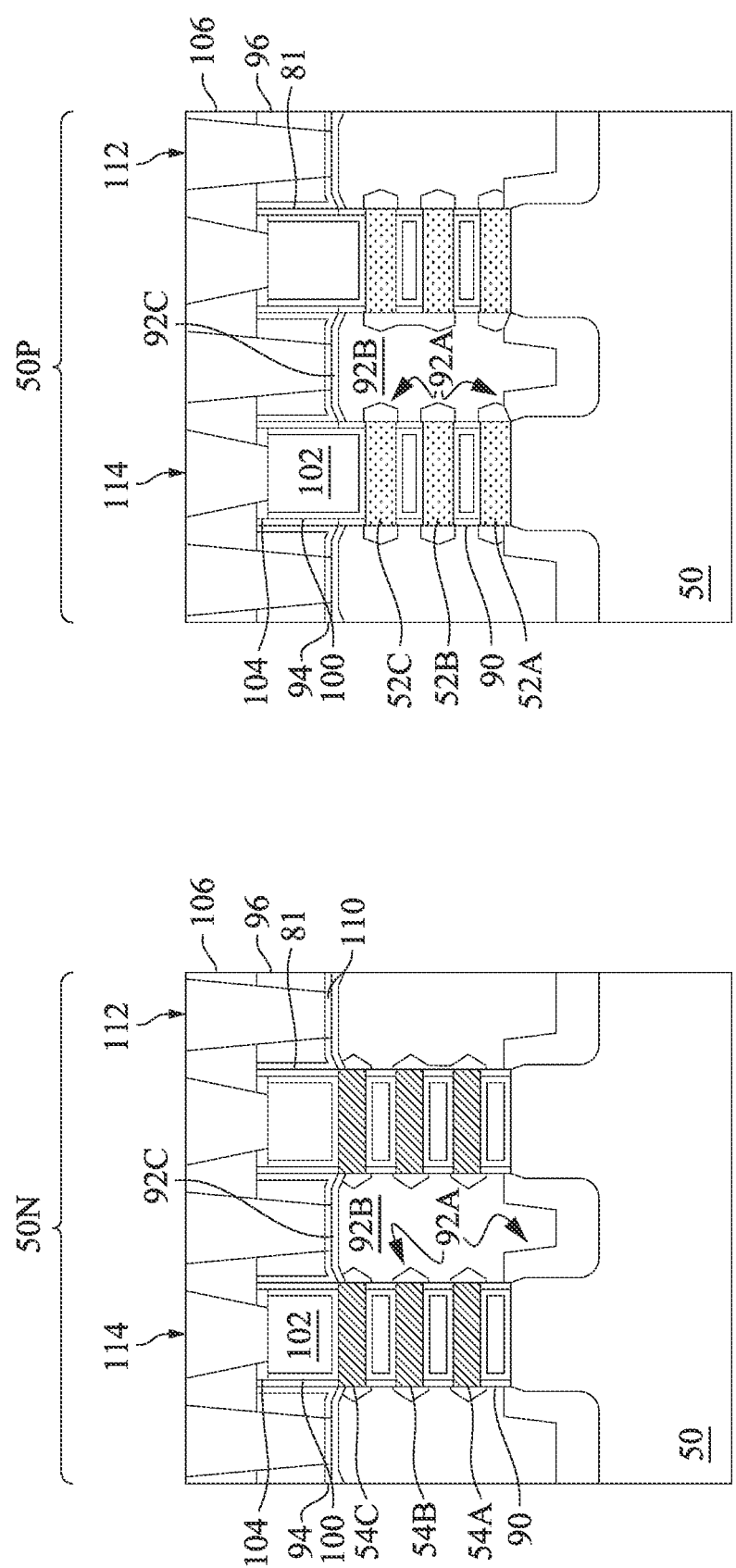
Figure 20C:
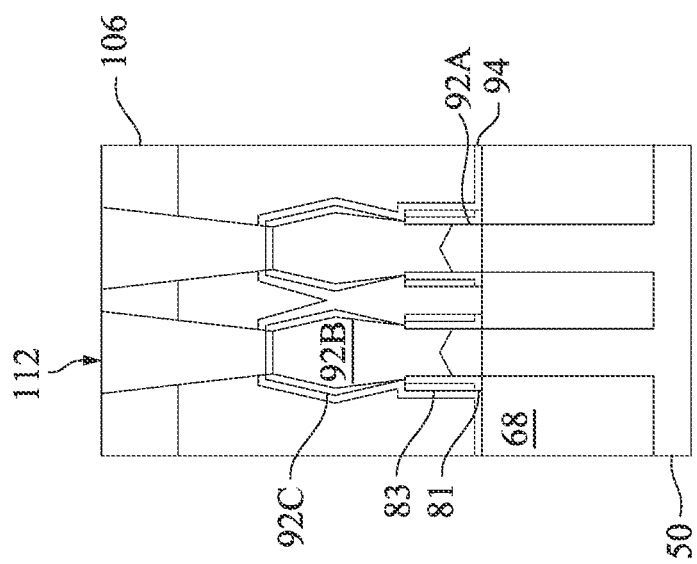

Next, in FIGS. 20A-C, contacts 112 and 114 (may also be referred to as contact plugs) are formed in the third recesses 108. The contacts 112 and 114 may each comprise one or more layers, such as barrier layers, diffusion layers, and fill materials. For example, in some embodiments, the contacts 112 and 114 each include a barrier layer and a conductive material, and are electrically coupled to the underlying conductive feature (e.g., gate electrodes 102 and/or silicide region 110 in the illustrated embodiment). The contacts 114 are electrically coupled to the gate electrodes 102 and may be referred to as gate contacts, and the contacts 112 are electrically coupled to the silicide regions 110 and may be referred to as source/drain contacts. The barrier layer may include titanium, titanium nitride, tantalum, tantalum nitride, or the like. The conductive material 118 may be copper, a copper alloy, silver, gold, tungsten, cobalt, aluminum, nickel, or the like. A planarization process, such as a CMP, may be performed to remove excess material from a surface of the second ILD 106.

Embodiments may achieve advantages. For example, using the above outlined process, it has been noted that the first semiconductor material layer 92A is less likely to merge over the first inner spacers 90 between adjacent first nanostructures 52, such that the first semiconductor layer 92A comprises a plurality of segments as illustrated in FIG. 12B. The process has been shown to result in fewer defect stacking fault creations in epitaxial source/drain region 92 than if a bottom-up growth process was not used. By minimizing defect stacking faults and reducing mergers of the first semiconductor material layer 92A across first inner spacers 90, the nano-FETs exhibit lower resistivity, and higher current carrying capacity, from the epitaxial source/drain region 92, to the channel formed by the first nanostructures 52 (in the p-type region 50P) and second nanostructures 54 (in the n-type region 50N). Thus, the nano-FET capacity and electrical performance is improved.

In an embodiment, a nano-FET device is provided including a substrate, the substrate including a fin, isolation regions over the substrate and along opposing sides of the fin, a plurality of nanostructures over the fin, an epitaxial source/drain region adjacent the plurality of nano structures, the epitaxial source/drain region includes first semiconductor material segments, each of the first semiconductor material segments contacting an end of at least one of the plurality of nanostructures, each of the first semiconductor material segments being separated from others of the first semiconductor material segments, the first semiconductor material segments having a first dopant concentration of dopants of a first conductivity type, and a second semiconductor material layer having a second dopant concentration of dopants of the first conductivity type, the second dopant concentration being greater than the first dopant concentration, the second semiconductor material layer including a single layer covering each of the first semiconductor material segments; and a gate electrode over the plurality of nanostructures. In some embodiments, the first dopant concentration is between $1\times10^{20}$ atoms/cm$^3$ and $5\times10^{20}$ atoms/cm$^3$. In some embodiments, the second dopant concentration is between $5\times10^{20}$ atoms/cm$^3$ and $10\times10^{20}$ atoms/cm$^3$. In some embodiments, the first semiconductor material segments include $Si_{1-x\_L1}Ge_{x\_L1}$, where x_L1 is between 0.1 and 0.4. In some embodiments, the second semiconductor material layer includes $Si_{1-x\_L2}Ge_{x\_L2}$, where x_L2 is greater than or equal to 0.2 and less than or equal to 0.9, where x_L2 is greater than x_L1. In some embodiments, the epitaxial source/drain region further includes a third semiconductor material layer formed over the second semiconductor material layer, the third semiconductor material layer including a different material than the second semiconductor material layer. In some embodiments, each of the first semiconductor material segments contacts a single nanostructure of the plurality of nano structures.

In an embodiment, a nano-FET is provided including a substrate, a first nanostructure and a second nanostructure over the substrate, an epitaxial source/drain region contacting ends of the first nanostructure and the second nanostructure, the epitaxial source/drain region including a first semiconductor material layer including a first semiconductor material, the first semiconductor material layer including a first segment contacting the first nanostructure and a second segment contacting the second nanostructure, where the first segment is separated from the second segment; and a second semiconductor material layer over the first segment and the second segment, the second semiconductor material layer including a second semiconductor material, where the second semiconductor material layer has a higher concentration of dopants of a first conductivity type than the first semiconductor material layer, where the second semiconductor material layer and the first semiconductor material layer are silicon-based materials, where the second semiconductor material layer has a lower concentration percentage of silicon than the first semiconductor material layer; and a gate electrode over the first nanostructure and the second nanostructure. In some embodiments, the nano-FET further includes a third nanostructure over the second nanostructure, where the second segment extends continuously from the second nanostructure to the third nanostructure, where the gate electrode extends over the third nanostructure. In some embodiments, the first semiconductor material includes $Si_{1-x\_L1}Ge_{x\_L1}$, x_L1 being is between 0.1 and 0.4, where the second semiconductor material includes $Si_{1-x\_L2}Ge_{x\_L2}$, x_L2 being greater than or equal to 0.2 and less than or equal to 0.9, x_L2 being greater than x_L1. In some embodiments, the first semiconductor material has a first dopant concentration of boron between $1\times10^{20}$ atoms/cm$^3$ and $5\times10^{20}$ atoms/cm$^3$, where the second semiconductor material has a second dopant concentration of boron between $5\times10^{20}$ atoms/cm$^3$ and $10\times10^{20}$ atoms/cm$^3$. In some embodiments, the first semiconductor material layer has a thickness between 2 nanometers and 6 nanometers.

In an embodiment, a method for forming a nano-FET is provided including forming a plurality of nanostructures including alternating layers of a first semiconductor material and a second semiconductor material, forming a first recess in the plurality of nanostructures, ends of the plurality of nanostructures being exposed in the first recess, recessing ends of the plurality of nanostructures of the second semiconductor material to form a second recess, forming inner spacers in the second recess on the ends of the plurality of nanostructures of the second semiconductor material, forming source/drain regions in the first recess, forming the source/drain regions including, epitaxially growing a first semiconductor material layer on each end of the plurality of nanostructures of the first semiconductor material, where the first semiconductor material layer is discontinuous, and epitaxially growing a second semiconductor material layer over each of the first semiconductor material layers, where the first semiconductor material layer has a lower concentration of dopants of a first conductivity type than the second semiconductor material layer. In some embodiments, a dopant concentration of dopants of the first conductivity type in the first semiconductor material layer is between $1 \times 10^{20}$ atoms/cm$^3$ and $5 \times 10^{20}$ atoms/cm$^3$, where a dopant concentration of dopants of the first conductivity type in the second semiconductor material is between $5 \times 10^{20}$ atoms/cm$^3$ and $10 \times 10^{20}$ atoms/cm$^3$. In some embodiments, the first semiconductor material layer and the second semiconductor material layer include silicon germanium, where the second semiconductor material layer has a higher concentration of germanium than the first semiconductor material layer. In some embodiments, the first semiconductor material layer includes $Si_{1-x\_L1}Ge_{x\_L1}$, where x_L1 is between 0.1 and 0.4. In some embodiments, the second semiconductor material layer includes $Si_{1-x\_L2}Ge_{x\_L2}$, where x_L2 is greater than or equal to 0.2 and less than or equal to 0.9, where X_L2 is greater than x_L1. In some embodiments, the source/drain region includes a third semiconductor material layer formed over the second semiconductor material layer. In some embodiments, the first semiconductor material layer is discontinuous across each inner spacer between adjacent nanostructures. In some embodiments, the first semiconductor material layer is grown to a thickness between 2 nanometers and 6 nanometers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A nano-FET comprising:
   a substrate, the substrate comprising a fin;
   isolation regions over the substrate and along opposing sides of the fin;
   a plurality of first nanostructures over the fin;
   an epitaxial source/drain region adjacent the plurality of first nanostructures, the epitaxial source/drain region comprises:
      a first semiconductor material layer comprising first semiconductor material segments and a second semiconductor material segment, each of the first semiconductor material segments contacting an end of at least one of the plurality of first nanostructures, each of the first semiconductor material segments being separated from others of the first semiconductor material segments, the first semiconductor material segments having a first dopant concentration of dopants of a first conductivity type; and
      a second semiconductor material layer having a second dopant concentration of dopants of the first conductivity type, the second dopant concentration being greater than the first dopant concentration, the second semiconductor material layer comprising a single layer covering each of the first semiconductor material segments; and
   a gate electrode over the plurality of first nanostructures;
   wherein each of the first semiconductor material segments have a first thickness, each of the plurality of first nanostructures have a second thickness, the first thickness is greater than the second thickness for each first semiconductor material segment in contact with the end of the at least one of the plurality of first nanostructures, each nanostructure of the plurality of first nanostructures being separated by the gate electrode, a spacer is disposed between the gate electrode and the epitaxial source/drain region, the spacer being further disposed between adjacent nanostructures of the plurality of first nanostructures, and an interface between each nanostructure of the plurality of first nanostructures and each of the first semiconductor material segments having a shape curving outwards towards the epitaxial source drain region at the center; and
   wherein the second semiconductor material segment is on a recessed portion of the substrate adjacent to the fin, the second semiconductor material segment is discontinuous from the first semiconductor material segments, the second semiconductor material segment has the first dopant concentration of the first conductivity type.

2. The nano-FET of claim 1, wherein the first dopant concentration is between $1 \times 10^{20}$ atoms/cm$^3$ and $5 \times 10^{20}$ atoms/cm$^3$.

3. The nano-FET of claim 2, wherein the second dopant concentration is between $5 \times 10^{20}$ atoms/cm$^3$ and $10 \times 10^{20}$ atoms/cm$^3$.

4. The nano-FET of claim 1, wherein the first semiconductor material segments comprise $Si_{1-x\_L1}Ge_{x\_L1}$, wherein x_L1 is between 0.1 and 0.4.

5. The nano-FET of claim 4, wherein the second semiconductor material layer comprises $Si_{1-x\_L2}Ge_{x\_L2}$, wherein x_L2 is greater than or equal to 0.2 and less than or equal to 0.9, wherein x_L2 is greater than x_L1.

6. The nano-FET of claim 1, wherein the epitaxial source/drain region further comprises a third semiconductor material layer formed over the second semiconductor material layer, the third semiconductor material layer comprising a different material than the second semiconductor material layer.

7. The nano-FET of claim 1, wherein each of the first semiconductor material segments contacts a single nanostructure of the plurality of first nanostructures.

8. A nano-FET comprising:
   a substrate;
   a first nanostructure and a second nanostructure over the substrate in a stack;
   an epitaxial source/drain region contacting ends of the first nanostructure and the second nanostructure, the epitaxial source/drain region comprising:
      a first semiconductor material layer comprising a first semiconductor material, the first semiconductor material layer comprising a first segment contacting the first nanostructure, a second segment contacting the second nanostructure, and a third segment contacting a recessed portion of the substrate, wherein the first segment, the second segment, and the third segment are each discontinuous from each other; and a second semiconductor material layer over the first segment, the second segment, and the third segment, the second semiconductor material layer comprising a second semiconductor material, wherein the second semiconductor material layer has a higher concentration of dopants of a first conductivity type than the first semiconductor material layer, wherein the second semiconductor material layer and the first semiconductor material layer are silicon-based materials, wherein the second semiconductor material layer has a lower concentration percentage of silicon than the first semiconductor material layer; and a gate electrode between the first nanostructure and the second nanostructure, wherein a spacer separates the gate electrode from the epitaxial source/drain region, the spacer being further disposed between the first nanostructure and the second nanostructure;

wherein interfaces between the first nanostructure and the first segment, and the second nanostructure and the first segment, have a shape curving inwards away from the epitaxial source drain region at the center.

9. The nano-FET of claim 8, further comprising a third nanostructure in the stack over the second nanostructure, wherein the second segment extends continuously from the second nanostructure to the third nanostructure, wherein the gate electrode extends over the third nanostructure.

10. The nano-FET of claim 8, wherein the first semiconductor material comprises $Si_{1-x\_L1}Ge_{x\_L1}$, $X\_L1$ being is between 0.1 and 0.4, wherein the second semiconductor material comprises $Si_{1-x\_L2}Ge_{x\_L2}$, $x\_L2$ being greater than or equal to 0.2 and less than or equal to 0.9, $x\_L2$ being greater than $x\_L1$.

11. The nano-FET of claim 8, wherein the first semiconductor material has a first dopant concentration of boron between $1\times10^{20}$ atoms/cm$^3$ and $5\times10^{20}$ atoms/cm$^3$, wherein the second semiconductor material has a second dopant concentration of boron between $5\times10^{20}$ atoms/cm$^3$ and $10\times10^{20}$ atoms/cm$^3$.

12. The nano-FET of claim 11, wherein the first semiconductor material layer has a thickness between 2 nanometers and 6 nanometers.

13. A method for forming a nano-FET, the method comprising:

forming a plurality of nanostructure layers comprising alternating layers of a first semiconductor material and a second semiconductor material;

forming a first recess in the plurality of nanostructure layers to form a stack of a plurality of first nanostructures, ends of the plurality of first nanostructures being exposed in the first recess;

recessing ends of the plurality of first nanostructures of the second semiconductor material to form a second recess;

forming inner spacers in the second recess on the ends of the plurality of first nanostructures of the second semiconductor material;

forming source/drain regions in the first recess, wherein forming the source/drain regions comprising:

epitaxially growing a first semiconductor material layer on each end of the plurality of first nanostructures of the first semiconductor material and on an exposed and recessed portion of a semiconductor substrate adjacent to the plurality of first nanostructures, wherein the first semiconductor material layer is discontinuous between growth on a first plurality of end of the plurality of first nanostructures and the exposed portion of the semiconductor substrate, wherein the first semiconductor material layer is merged across a second plurality of ends of the first plurality of first nanostructures; and epitaxially growing a second semiconductor material layer over each of the first semiconductor material layers, wherein the first semiconductor material layer has a lower concentration of dopants of a first conductivity type than the second semiconductor material layer.

14. The method of claim 13, wherein a dopant concentration of dopants of the first conductivity type in the first semiconductor material layer is between $1\times10^{20}$ atoms/cm$^3$ and $5\times10^{20}$ atoms/cm$^3$, wherein a dopant concentration of dopants of the first conductivity type in the second semiconductor material layer is between $5\times10^{20}$ atoms/cm$^3$ and $10\times10^{20}$ atoms/cm$^3$.

15. The method of claim 13, wherein the first semiconductor material layer and the second semiconductor material layer comprise silicon germanium, wherein the second semiconductor material layer has a higher concentration of germanium than the first semiconductor material layer, and wherein the first semiconductor material layer on each end of the plurality of first nanostructures of the first semiconductor material is thicker than a nanostructure of the plurality of first nanostructures from which the first semiconductor material layer is epitaxially grown.

16. The method of claim 15, wherein the first semiconductor material layer comprises $Si_{1-x\_L1}Ge_{x\_L1}$, wherein $x\_L1$ is between 0.1 and 0.4.

17. The method of claim 16, wherein the second semiconductor material layer comprises $Si_{1-x\_L2}Ge_{x\_L2}$, wherein $x\_L2$ is greater than or equal to 0.2 and less than or equal to 0.9, wherein $X\_L2$ is greater than $x\_L1$.

18. The method of claim 13, wherein the source/drain region comprises a third semiconductor material layer formed over the second semiconductor material layer.

19. The method of claim 13, wherein the first semiconductor material layer is discontinuous across each inner spacer between adjacent nanostructures.

20. The method of claim 13, wherein the first semiconductor material layer is grown to a thickness between 2 nanometers and 6 nanometers.

* * * * *